(12) United States Patent
Sarig

(10) Patent No.: US 6,735,745 B2
(45) Date of Patent: May 11, 2004

(54) METHOD AND SYSTEM FOR DETECTING DEFECTS

(75) Inventor: Nimrod Sarig, Rosh Ha'Ayin (IL)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 10/072,313

(22) Filed: Feb. 7, 2002

(65) Prior Publication Data

US 2003/0149947 A1 Aug. 7, 2003

(51) Int. Cl.[7] .................. G06F 17/50; G06F 19/00; G06F 17/18; G06K 9/74; G06K 9/46
(52) U.S. Cl. .................. 716/4; 716/21; 703/1; 703/2; 382/203; 382/205; 382/144; 382/145; 382/151; 382/154
(58) Field of Search .................. 716/4, 21; 703/1, 703/2; 382/203, 205, 144, 145, 151, 154

(56) References Cited

U.S. PATENT DOCUMENTS

| | | | | |
|---|---|---|---|---|
| 3,972,616 A | * | 8/1976 | Minami et al. | 356/71 |
| 4,559,603 A | * | 12/1985 | Yoshikawa | 716/5 |
| 4,579,455 A | * | 4/1986 | Levy et al. | 356/394 |
| 5,345,514 A | * | 9/1994 | Mahdavieh et al. | 382/152 |
| 6,498,685 B1 | * | 12/2002 | Johnson | 359/626 |
| 6,515,913 B2 | * | 2/2003 | Kajigaya et al. | 365/189.02 |
| 2003/0099022 A1 | * | 5/2003 | Karin et al. | 359/201 |

FOREIGN PATENT DOCUMENTS

JP          04311277 A  * 11/1992 ........... G06F/15/62

OTHER PUBLICATIONS

Ong et al., "Acoustic microscopy reveals IC packaging hidden defects", Proceedings of the 1997 1st Electronic Packaging Technology Conference, Oct. 8, 1997, pp. 297–303.*

Baraldi et al., "A refined gamma MAP SAR speckle filter with improved geometrical adaptivity", IEEE Transactions on Geoscience and Remote Sensing, vol. 33, No. 5, Sep. 1995, pp. 1245–1257.*

Hu et al., "Efficient and consistent method for superellipse detection", IEE Proceedings of Vision, Image and Signal Processing vol. 148, No. 4, Aug. 2001, pp. 227–233.*

Sheu et al., "Consistent symmetric axis method for robust detection of ellipses", IEE Proceedings of Vision, Image and Signal Processing, vol. 144, No. 6, Dec. 1997, pp. 332–338.*

* cited by examiner

Primary Examiner—Matthew Smith
Assistant Examiner—Phallaka Kik
(74) Attorney, Agent, or Firm—Blakely Sokoloff Taylor and Zafman LLP

(57) ABSTRACT

Method for detecting defects, the method comprising the procedures of identifying theoretically-symmetrical windows in an object-image; analyzing the theoretically-symmetrical windows according to expected symmetry of the theoretically-symmetrical windows; and determining the presence of defects according to a deviation from the expected symmetry.

36 Claims, 24 Drawing Sheets

METHOD AND SYSTEM FOR DETECTING DEFECTS

FIELD OF THE DISCLOSED TECHNIQUE

The disclosed technique relates to method and systems for detecting defects in general, and to methods and systems for detecting defects in semiconductor manufacturing procedures, in particular.

BACKGROUND OF THE DISCLOSED TECHNIQUE

A photographic mask or photomask is used in the fabrication process of manufacturing large-scale integrated (LSI) semiconductor circuits, very-large-scale integrated (VLSI) semiconductor circuits or ultra-large scale integrated (ULSI) semiconductor circuits. The manufacturing of a wafer typically calls for the use of a plurality of different photographic masks, each for imprinting a different layer on the wafer. All of these photographic masks can be reused again and again for producing many wafers. In general, a photographic mask is imprinted with a pattern, according to a predetermined pattern. It shall be appreciated by those skilled in the art that the pattern imprinted on the photographic mask should be essentially identical to the predetermined pattern. Any deviation of the photographic mask pattern from the predetermined pattern would consist a defect and shall render that photographic mask defective. It is noted that the use of a defective photographic mask shall yield defective wafers.

Hence it is important to detect such defects. When a defect is found, either the photographic mask is discarded or the defect is analyzed to determine if it can be repaired. Therefore, it is also important that the inspection system shall not declare "false defects" (i.e., declare a defect for a non-defective photographic mask).

Semiconductor chips are becoming more and more complex and condensed in structure and smaller in size, and are thus more prone to defects. A conventional method for detecting defects often includes several different test procedures.

Defects in a photomask may take the form of holes ("pinholes"), "cracks", spots and the like. Defects can be introduced into a mask during manufacturing, handling or transportation. Hence, a mask has to be inspected for defects after manufacturing and further routinely.

Integrated circuit photographic mask inspection methods may generally be divided into die-to-die methods and die-to-database methods. In a die-to-die inspection, two portions of the photographic mask (die patterns) which are supposed to be identical are compared, and significant differences between them indicate a probable defect in one of the die patterns. This inspection based on the assumption that there is a very low probability that the same defect shall appear in both dies. When a defect is found, a comparison with a third die pattern can indicate which of the original two die patterns is defective.

In a die-to-database method, an image representing a proper (defect-free) photographic mask is stored in a database. The database image and the actual image of the photographic mask die pattern are compared, and significant differences there between, indicate a probable defect.

U.S. Pat. No. 3,972,616 issued to Minami et al., entitled "Apparatus for Detecting the Defects of the Mask Pattern Using Spatial Filtering," is directed to an apparatus for die-to-database defect inspection. In the disclosed apparatus, a portion of the inspected photographic mask is illuminated simultaneously by a coherent light source and an incoherent light source, each of a different color. The image is passed through a spatial filter and projected on a screen. The spatial filter corresponds to the Fourier spectrum of the proper photographic mask pattern. The filter has wavelength selectivity, so that it filters only light of the wavelength of the coherent light. Thus, the filter causes the defect to be displayed on the screen in the color of the coherent light source. Due to its wavelength selectivity, the filter passes most of the light from the incoherent light source. Thus, the entire image of the portion of the photographic mask is displayed in the color of the incoherent light. This simultaneous display of the defect in one color and entire portion of the mask in another color enables the location of the defect in the photographic mask.

U.S. Pat. No. 4,559,603 entitled "Apparatus for Inspecting a Circuit Pattern Drawn on a Photomask Used in Manufacturing Large Scale Integrated Circuits", issued to Yoshiwaka, is directed to an apparatus for die-to-database photographic mask inspection. A circuit drawn on a photomask is placed on an X-Y table, and illuminated. A linear image sensor measures the light transmitted through the photographic mask and produces analog measure signals. These signals are converted to digital signals representing a multilevel gray image. Simultaneously, a laser interferometric measuring system precisely monitors the table position relative to the photographic mask. The image sensor is synchronized with the table position measurement, using a reference clock. A reference image is generated using the table position coordinates. Since these coordinates are generally not an integer number of pixels, the reference image is shifted accordingly by convolution with a predetermined function. The reference data and the actual image data from the image sensor are compared and defects are reported.

U.S. Pat. No. 4,579,455 entitled "Photomask Inspection Apparatus and Method with Improved Defect Detection," issued to Levy et al., is directed to an apparatus and method for performing die-to-die inspection of a photomask. Two die patterns are inspected to reveal differences there between. Two digitized image sensors and two memories are used to generate pixel representations of two die patterns of a photographic mask. At any given moment, each memory contains the pixel representation of a 7×7-pixel portion of the inspected die. A defect detector determines whether the two representations match. The defect detector accounts for misalignment of the dies of up to two pixels, by checking different possible alignments of the inspected portions. If none of the examined possible alignments results in a match, the system declares a defect at the corresponding location in one of the die patterns.

The article entitled "Anomaly Detection through Registration", by M. Chen et al., is directed to a method for performing registration of medical images of inspected organs of living creatures. Chen describes a method for detecting of anomalies in the brain. This method uses the fact that a normal brain is essentially symmetrical with respect to its central line. The inspection process involves registration between an image of the brain and the same image flipped with respect to the central line. The registration process involves deformation of the pixels (picture elements) of one image, which causes the images to match. Thus, if the registration between the brain image and the flipped brain image yields significant pixel deformation, it is concluded that there is an anomaly in the inspected brain.

SUMMARY OF THE DISCLOSED TECHNIQUE

It is an object of the disclosed technique to provide a novel method and system for detecting irregularities in an image, which overcomes the disadvantages of the prior art. In accordance with the disclosed technique, there is thus provided a method for detecting irregularities in an image. The method includes the procedures of identifying theoretically-symmetrical elements within the image, analyzing the theoretically-symmetrical elements according to their theoretical symmetry, and determining the presence of defects according to the deviation from the theoretical symmetry.

BRIEF DESCRIPTION OF THE DRAWINGS

The disclosed technique will be understood and appreciated more fully from the following detailed description taken in conjunction with the drawings in which.

DETAILED DESCRIPTION OF THE EMBODIMENTS

Figure 1:
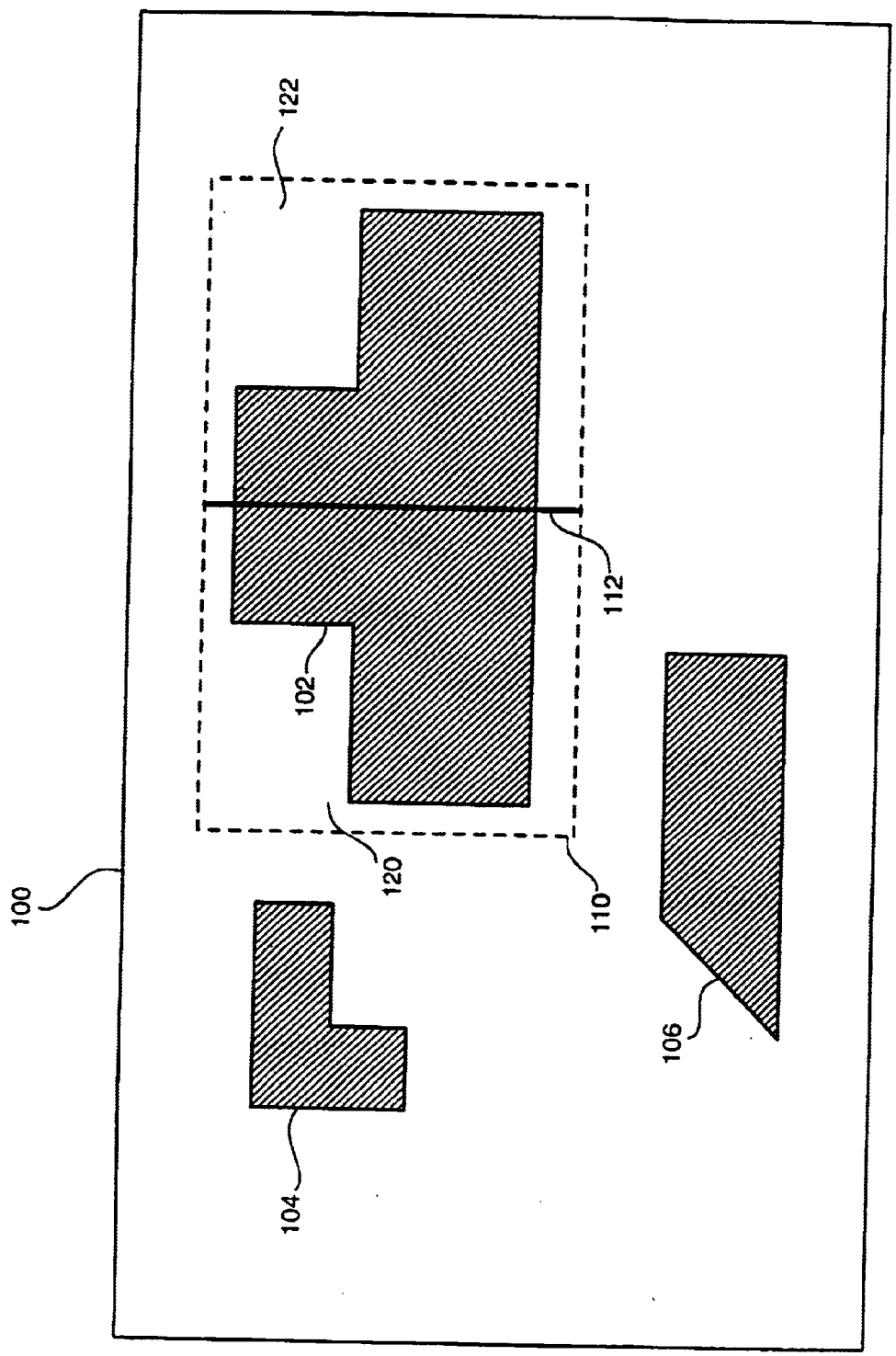
FIG. 1 is a schematic illustration of a database-image.

The disclosed technique overcomes the disadvantages of the prior art by providing a novel method and system for detecting defects in semiconductor manufacturing procedures, using symmetry analysis.

In the following description the following terms are used:

Object-Image—an image representing a physical object. Such an object can be a mask, a die, fabric, and the like.

Database-Image—an image which has been stored in a database. A database image can either be generated virtually by means of computerized design tools, or be acquired from any source such as a camera, a scanner, and the like.

Image element—a portion of an image that can be distinguished from other areas of an image.

Defect—a missing part of an image element, or a redundant image element or part thereof.

Region—any portion of an image.

Window—a region, selected specifically for detecting properties therein. In the drawings which are associated with the following description, windows are designated by perforated lines.

Pixel—a picture element, which is the basic visual unit of an image.

Manipulation—a mathematical or physical operation performed on an image or a region, such as rotation, flipping, magnification, and the like, or any combination thereof.

Manipulated form of an image (or a region)—the image produced by the manipulation of an existing image.

Symmetry-testing window—a window, which is selected specifically for detecting symmetry properties thereof, or the deviation from the symmetry properties.

Symmetrical-similarity—a property of two images, wherein one image can be produced from the other image by symmetry oriented manipulation and at least an optional manipulation, which is selected from a predetermined set of manipulations or a combination thereof.

Theoretically-symmetrical windows—windows which are expected to exhibit the same symmetry properties as their respective database-image windows, assuming no defects are present therein.

Theoretically symmetrically-similar windows—windows, which are expected to exhibit symmetrical-similarity, assuming no defects are present therein.

Theoretically-identical windows—windows, which are expected to be identical, assuming no defects are present therein.

Registration—a process in which, every portion of a first image (or region) is associated with a respective portion of a second image, thereby determining a correlation function. Such a registration process may also be referred to as "registering the first image with the second image".

Axial Symmetry—a property of an image (or region), which can be divided by a symmetry line into two sides, wherein one side of the image is a mirror image of the other side.

Rotational Symmetry—a property of an image (or region), wherein at least one portion of the image can be rotated about an axis, thereby becoming identical to at least another portion of the image. This axis is called the axis of rotation, and the angle by which the image is rotated is called the angle of rotation.

Axial-rotational Symmetry—a property of an image (or region), wherein at least one portion of the image can be rotated and flipped, thereby becoming identical to at least another portion of the image.

In the following description and the associated drawings, windows, sections, regions, and symmetry-lines are illustrated in the drawings for purposes of explanation only, and do not appear in the actual images.

Reference is now made to FIG. 1, which is a schematic illustration of a database-image, generally referenced 100. Database-image 100 represents a predetermined circuit pattern, which is to be imprinted on a photographic mask or a die. In FIG. 1 and some of the following figures, hatched areas indicate regions of non-zero intensity and blank areas indicate regions of zero or near-zero intensity. Database-image 100 includes database-image elements 102, 104 and 106 dispensed at different locations therein.

Database-image element 102 is surrounded by a rectangular window 110 and is split by a vertical symmetry-line 112. Database-image element 102 and window 110 are both symmetrical with respect to symmetry-line 112. Symmetry-line 112 divides window 110 into a left window-section 120 and a right window-section 122. Left window-section 120 and right window-section 122 have equal areas.

Figure 2:
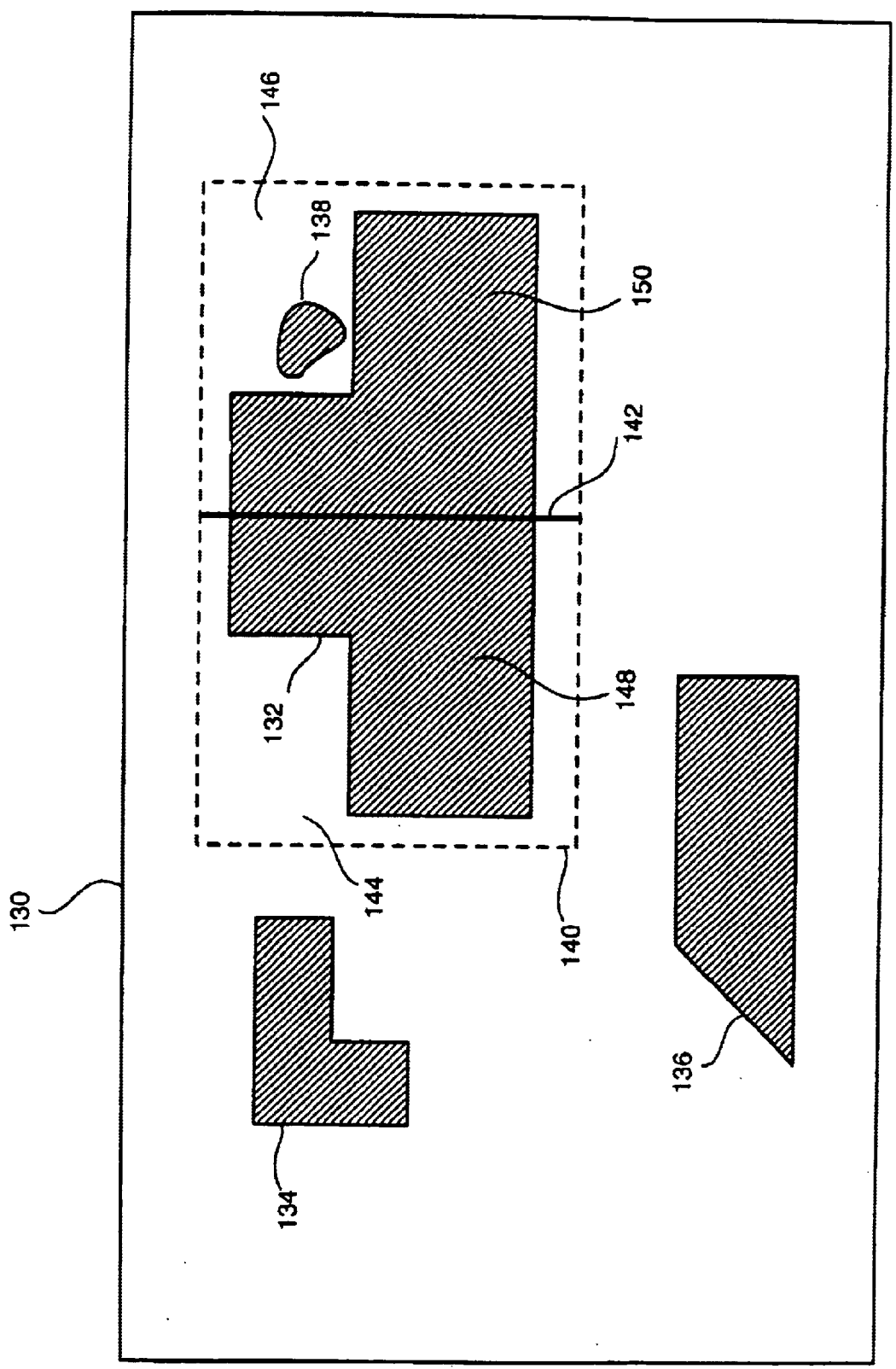
FIG. 2 is a schematic illustration of an inspected object-image.

Reference is further made to FIG. 2, which is a schematic illustration of an inspected object-image, generally referenced 130. Object-image 130 may represent a photographic mask, a reticle die, fabric, printed material, and the like, which is also represented in database-image 110. Alternatively, object-image 130 may be a reproduction of database-image 110. Object-image 130 includes object-image elements 132, 134 and 136. Database-Image elements 102, 104 and 106 of FIG. 1, represent in database-image 100 (FIG. 1) object-image elements 132, 134 and 136, respectively. Object-image 130 further includes a defect 138, which is located in close proximity to object-image element 132.

Defects in an object-image such as in a photographic mask used for manufacturing semiconductor chips, may take the form of holes ("pinholes"), "cracks", spots and the like. Defects can be introduced into such a mask during manufacturing, handling or transportation. Hence, the mask has to be inspected for defects after manufacturing and further routinely. According to one aspect the disclosed technique a mask is inspected by examining an object-image thereof.

Object-image element 132 and defect 138 are surrounded by a rectangular window 140. A vertical symmetry-line 142 splits window 140 into a left window-section 144 and a right window-section 146. Left window-section 144 and right window-section 146 have equal areas. Object-image element 132 is symmetrical with respect to symmetry-line 142. Symmetry-line 142 divides object-image element 132 into a left element-portion 148 and a right element-portion 150. Defect 138 is located in right window-section 146.

Window 110 of database-image 100 (FIG. 1) is respective of window 140 in object-image 130. Accordingly, the size and position of window 140 may be derived from window 110 in database-image 100 (FIG. 1). Since window 110 is symmetrical with respect to symmetry-line 112, window 140 should also be symmetrical, but with respect to symmetry-line 142, assuming no defects are present therein.

Figure 3A:
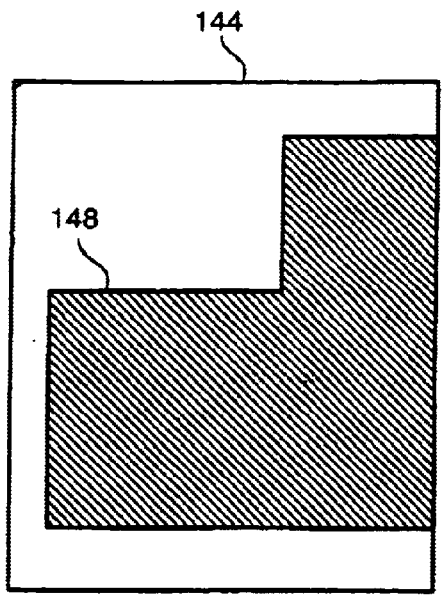
FIG. 3A is a schematic illustration of the left window-section of the window of FIG. 2, including a left element-portion.
Figure 3B:
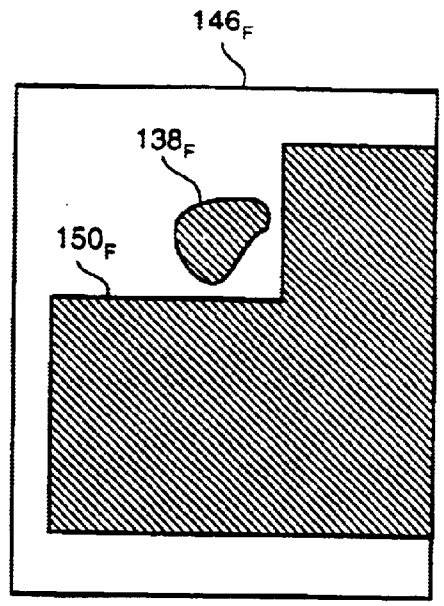
FIG. 3B is a schematic illustration of a flipped image, which is a flipped form of the right window-section of the window of FIG. 2, constructed in accordance with an embodiment of the disclosed technique.
Figure 3C:
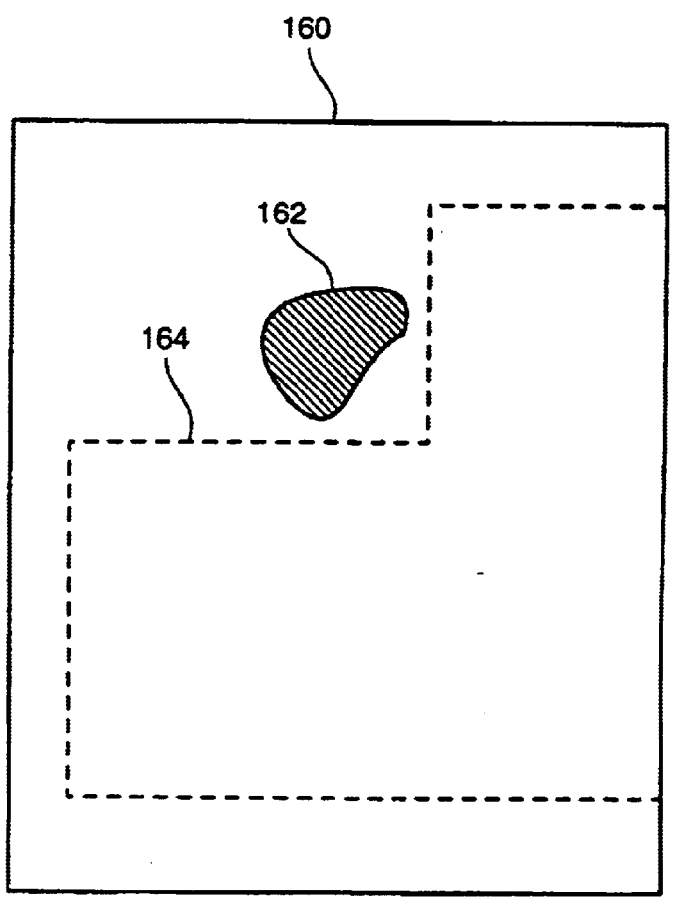
FIG. 3C is a schematic illustration of a difference image, constructed in accordance with another embodiment of the disclosed technique.

Reference is further made to FIGS. 3A, 3B and 3C. FIG. 3A is a schematic illustration of left window-section 144

(FIG. 2), including left element-portion 148. FIG. 3B is a schematic illustration of a flipped image, generally referenced 146$_F$, which is a flipped form of right window-section 146 (FIG. 2), constructed in accordance with an embodiment of the disclosed technique. FIG. 3C is a schematic illustration of a difference image, generally referenced 160, constructed in accordance with another embodiment of the disclosed technique.

With reference to FIG. 3B, flipped image 146$_F$ is formed by horizontally flipping right window-section 146, i.e.—by its turning over about axis 142. Flipped image 146$_F$ includes a flipped right element-portion 150$_F$ and a flipped defect 138$_F$. Flipped right element-portion 150$_F$ and flipped defect 138$_F$ are horizontally flipped forms of right element-portion 150 and defect 138 (FIG. 2), respectively.

It is noted that a defect detection procedure, according to the disclosed technique, performs manipulations (i.e., flipping, rotation, magnification, and the like) mathematically, in a computerized manner. Accordingly, the detection procedure produces a computed manipulated image, without producing the actual manipulated image. Alternatively, the detection procedure can access the to-be-manipulated image through a manipulation function (e.g., wherein flipping horizontally is expressed $f(x,y)=(-x,y)$, where $(x,y)$ define the coordinates of each point in the to-be-flipped image, and the Y axis defines the symmetry-line). For example, the procedure may access flipped image 146$_F$ using data from right window-section 146 (FIG. 2). However, the manipulated image can be presented to the user on a display.

With reference to FIG. 3C, difference image 160 includes a defect region 162 and a blank region 164. Blank region 164 has the same geometric locus in difference image 160, as left element-portion 148 (FIG. 3A) and flipped right element-portion 150$_F$ (FIG. 3B) in left window-section 144 (FIG. 3A) and in flipped image 146$_F$, respectively. Blank region 164 has zero intensity. Defect region 162 has same geometric locus in difference image 160 as flipped defect 138$_F$ in flipped image 146$_F$. Defect region 162 has non-zero intensity.

Difference image 160 is produced by performing a subtraction operation between flipped image 146$_F$ (FIG. 3B) and left window-section 144 (FIG. 3A). A subtraction operation between two images consists of subtracting the intensity value of each pixel of a first image from the respective pixel of a second image. In mathematical terms, a simple form of the subtraction operation is $I_s(x,y)=I_2(x,y)-I_1(x,y)$, wherein x and y designate the coordinates for the selected pixel, and $I_1(x,y)$, $I_2(x,y)$, $I_s(x,y)$ denote the intensity values of the first image, the second image, and the difference image, respectively. It is noted that, as noted above regarding the manipulations, the subtraction operation can be performed mathematically, without producing the actual difference image. In difference image 160, the subtraction of a zero-intensity region (not indicated) in left window-section 144 (FIG. 3A) from flipped defect 138$_F$, which has non-zero intensity in flipped image 146$_F$ (FIG. 3B), yields non-zero intensity in defect region 162. The subtraction of left element-portion 148, which has non-zero intensity, from flipped right element-portion 150$_F$, which also has non-zero intensity, yields a near-zero intensity in blank region 164.

It is noted that the intensities $I_s(x,y)$ of pixels in the difference image may generally be positive, negative or zero. In the present example, the intensity values of difference image 160 are all positive or zero. However, if flipped image 146$_F$ (FIG. 3B) was subtracted from left window-section 144 (FIG. 3A), the difference image would include negative values.

To detect defects, difference image 160 is examined according to predetermined criteria. The presence of regions having non-zero intensity in difference image 160, indicates that the respective regions in flipped image 146$_F$ (FIG. 3B) and left window-section 144 (FIG. 3A) differ in their intensities. This difference may exist due to a defect in right window-section 146 or in left window-section 144. Hence, the predetermined criteria for defect detection may be for example, that a significant part of difference image 160 has non-zero intensity, alternatively that the intensity of a portion of difference image 160 is above a predetermined positive threshold level or below a negative threshold level, and the like. If the difference image meets the predetermined criteria, then there is a significant difference between the left window-section 144 and flipped image 146$_F$, which indicates the presence of a probable defect. Hence, the method of the disclosed technique concludes that a defect exists in one of those areas. Otherwise, other defect detection procedures may be applied.

Alternatively, an absolute subtraction operation may be used, yielding an absolute difference image instead of difference image 160. An absolute subtraction operation between two images consists of taking the absolute difference between the intensity values I of the images for each pixel. The mathematical expression $|I_1(x,y)-I_2(-x,y)|$ determines a simple form for such an absolute subtraction, wherein x and y designate the coordinates for the selected pixel, and $I_1(x,y)$ and $I_2(x,y)$ denote the intensity values of the first and second images, respectively. If, for example, the image is binary, with pixel intensity values 0 and 1, then the absolute subtraction operation is identical to a XOR operation (i.e., a XOR operation is defined by 1 XOR 0=0 XOR 1=1; 1 XOR 1=0 XOR 0=0). It is noted that, contrary to ordinary subtraction, the absolute subtraction operation is symmetrical with respect to the order of the operands (i.e., the outcome of an absolute subtraction between a first image and a second image is identical to the outcome of an absolute subtraction between the second image and the first image). It is further noted that an absolute difference image consists of zero-intensity regions and positive-intensity regions. Hence, the criteria for defect detection in an absolute difference image may be for example, that a significant portion of the image is positive, alternatively that the intensity of some portion of the image exceeds a predetermined positive threshold level, and the like. For example, a weighted sum of absolute differences may be used as a criterion for defect detection. Accordingly, each portion of the image is assigned a predetermined weight. The absolute difference at each portion is multiplied by its respective weight and the resulting products are summed. The sum is compared to a predetermined threshold level to determine whether a defect is present.

In the present example, since difference image 160 has only positive and zero intensity, the difference image and the absolute difference image are essentially identical. However, if flipped image 146$_F$ (FIG. 3B) was subtracted from left window-section 144 (FIG. 3A), the difference image would include negative and zero intensities, while the absolute difference would still include positive and zero intensities.

It is noted that in difference image 160, and in the other difference images and absolute difference images illustrated hereinafter, it is assumed that regions of non-zero intensities in object-images have uniform or nearly uniform intensities, and hence, subtracting non-zero intensities yields zero or near-zero intensities. It is further noted that the terms "near-zero intensity region", "zero intensity region" and "blank region", are used herein interchangeably, meaning "zero or near-zero intensity region".

For example, the assumption of uniform non-zero intensities is valid in binary images, wherein all regions having non-zero intensities, have the exact same intensities. This assumption is also likely to be valid in non-binary images, wherein the compared non-zero regions are different portions of the same object-image element, or regions of different object-image elements. The assumption may be invalid near edges, where the intensity may vary considerably in a continuous manner. The disclosed technique addresses such invalidation by applying interpolation, which is described in conjunction with FIGS. 19, 20A and 20B.

Figure 4:
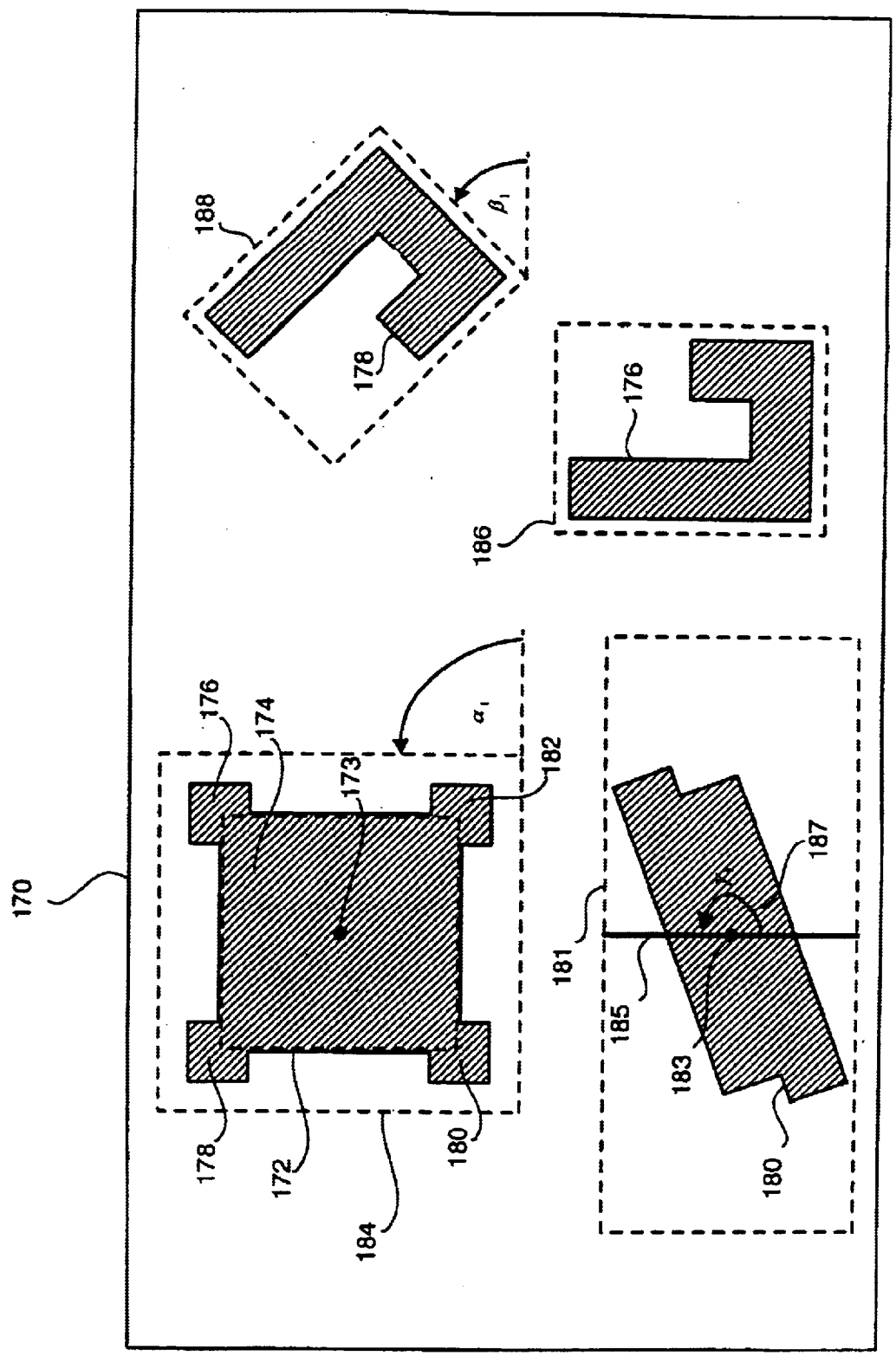
FIG. 4 is a schematic illustration of a database-image.

The defect detection according to the disclosed technique addresses different types of symmetry, such as axial symmetry with horizontal, vertical or diagonal axes, rotational symmetry, a combination thereof, and the like. Reference is now made to FIG. 4, which is a schematic illustration of a database-image, generally referenced 170. Database-image 170 represents a predetermined circuit pattern to be imprinted on a physical object, wherein the pattern contains elements which exhibit rotational symmetry and elements which exhibit axial-rotational symmetry. Database-image 170 includes database-image elements 172, 176, 178 and 180, dispensed at different locations therein. Database-image elements 172, 176, 178, 180 are surrounded by windows 184, 186, 188, and 181, respectively.

Database-Image element 178 is identical to database-image element 176, if horizontally flipped and rotated counterclockwise by an angle $\beta_1$, wherein in the present example, $\beta_1$=45 degrees. Database-Image element 180 has rotational symmetry about an axis perpendicular to the drawing sheet plane, designated 183, namely—rotation of object-image element 180 in the drawing sheet plane, about axis 183 by an angle $\gamma_1$=180 degrees (clockwise or counter-clockwise), results in identity between the original and the rotated form of object-image element 180. It is noted that database-image element 180 also exhibits axial symmetry, namely—any dividing line that crosses axis 183 in the drawing sheet plane, such as line 185, defines two halves of element 180, whereby each such half is identical to a twice flipped form of the other, with respect to two perpendicular axes. Database-image element 172 includes a square portion 174, a top-right corner enhancement 176, a top-left corner enhancement 178, a bottom-left corner enhancement 180 and a bottom-right corner enhancement 182. Corner enhancements 176, 178, 180 and 182 have been added to database-image element 172 for the purpose of correcting the corner rounding phenomenon, which may occur in the wafer manufacturing process. Database-image element 172 has rotational symmetry about an axis perpendicular to the drawing sheet plane, designated 173, with an angle of rotation $\alpha_1$=90 degrees (clockwise or counter-clockwise). It is noted that database-image element 172 also exhibits axial symmetry, with respect to vertical, horizontal and diagonal symmetry-lines.

Figure 5:
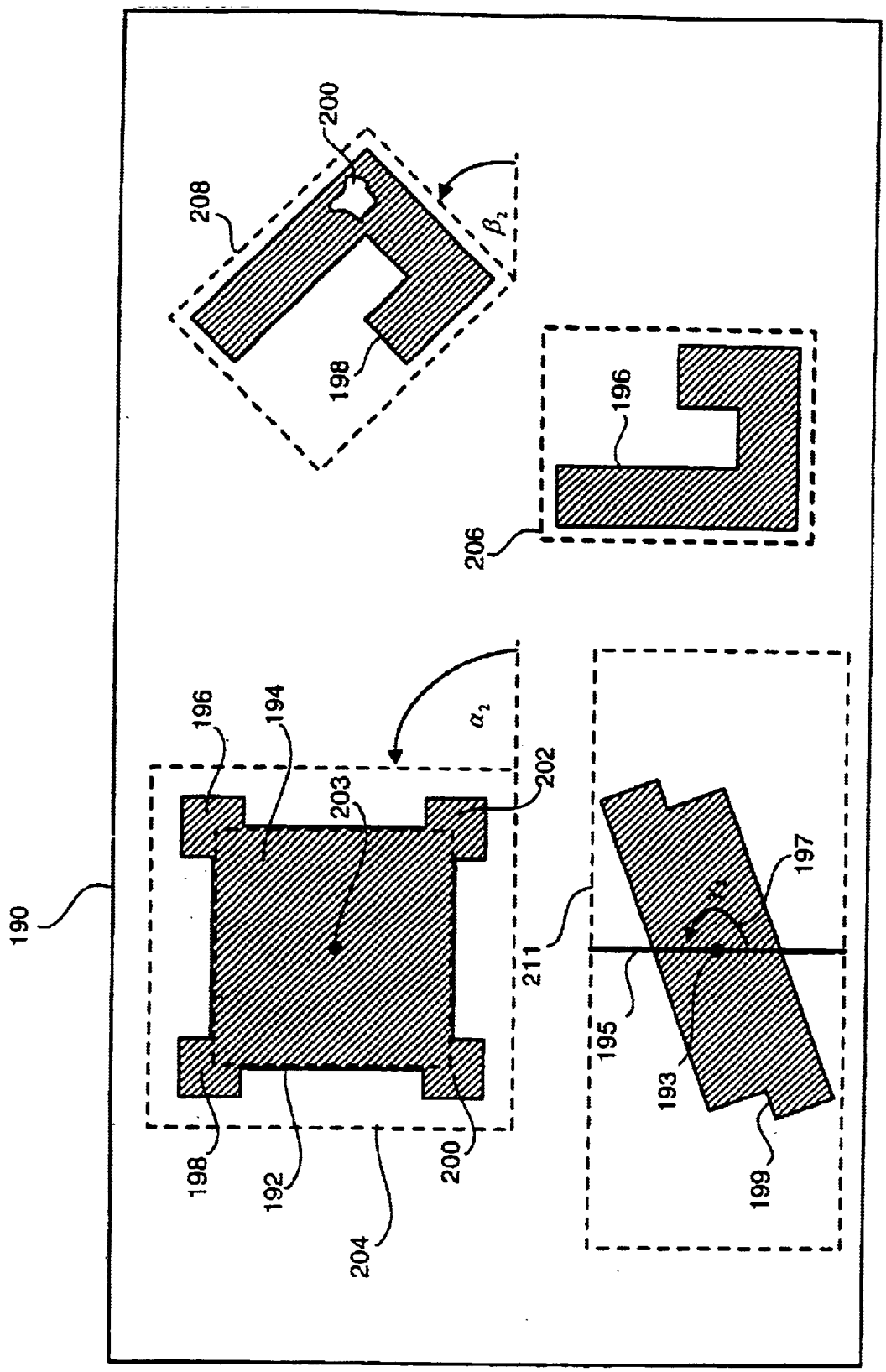
FIG. 5 is a schematic illustration of an image of an inspected object-image.

Reference is further made to FIG. 5, which is a schematic illustration of an inspected object-image, generally referenced 190. Object-image 190 includes object-image elements 192, 196, 198, and 199. Object-image elements 192, 196, 198 and 199 are represented in database-image 170 (FIG. 4) by database-image elements 172, 176, 178, and 180, respectively. Object-image 190 further includes a defect 200. In the present example, the area defined by defect 200 should have been of the same properties as object-image element 198.

Object-image elements 192, 196, 198, and 199 are surrounded by windows 204, 206, 208, and 211, respectively. Object-image element 194 is identical to object-image element 192, if rotated counterclockwise by an angle $\alpha_2$, wherein angle $\alpha_2$ is the same angle as angle $\alpha_1$ of FIG. 4. According to the analysis of database-image 170 (FIG. 4), object-image element 198 should be identical to object-image element 196, if horizontally flipped and rotated counterclockwise by angle $\beta_2$=$\beta_1$. However, a symmetry based comparison between object-image elements 198 and 196 shall not yield such identity, since object-image element 198 includes defect 200. Object-image 199 exhibits rotational symmetry about a perpendicular axis 193, when rotated at an angle $\gamma_2$=$\gamma_1$, in analogy to the explanation regarding the rotation of object-image element 180 about axis 185.

Windows 204, 206, 208, and 211 are represented in database-image 170 (FIG. 4) by windows 184, 186, 188, and 181, respectively. Accordingly, the sizes and positions of windows 204, 206, 208 and 211 may be derived from the sizes and positions of windows 184, 186, 188, and 181, respectively.

Since window 184 exhibits a rotational symmetry with an angle of rotation $\alpha_1$, windows 202 and 204 should exhibit a rotational symmetry with an angle of rotation $\alpha_2$=$\alpha_1$, assuming no defects are present. Hence, rotating window 184 clockwise by an angle $\alpha_2$ shall result in complete identity between the original and the rotated form of window 184.

Since windows 186 and 188 exhibit an axial-rotational symmetry with an angle of rotation $\beta_1$, windows 206 and 208 should exhibit an axial-rotational symmetry with an angle of rotation $\beta_2$=$\beta_1$, assuming no defects are present. Hence, rotating window 208 clockwise by an angle $\beta_2$, and then flipping it horizontally, should yield a window identical to window 206. Since window 181 exhibits a rotational symmetry with an angle of rotation $\gamma_1$, window 211 should exhibit a rotational symmetry with an angle of rotation $\gamma_2$=$\gamma_1$, assuming no defects are present. Hence, rotating window 211 by an angle $\gamma_2$, shall result in complete identity between the original and the rotated window 211.

Figure 6A:
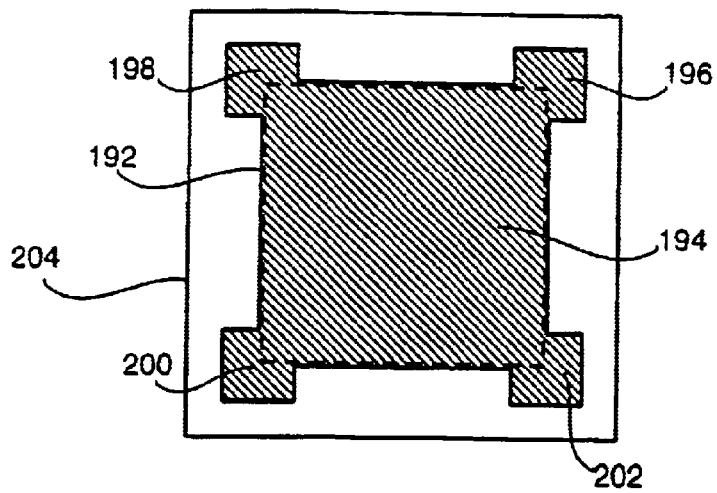
FIG. 6A is a schematic illustration of a window of FIG. 5, including an object-image element.
Figure 6B:
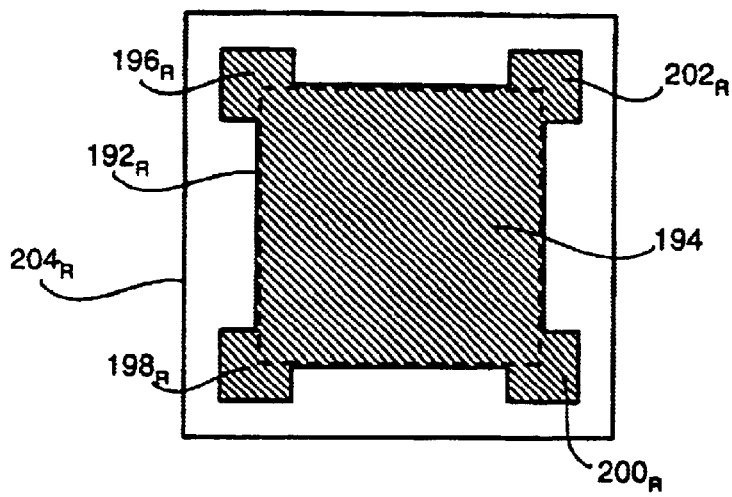
FIG. 6B is a schematic illustration of a rotated image, which is a rotated form of the window of FIG. 6A, constructed in accordance with further embodiment of the disclosed technique.
Figure 6C:
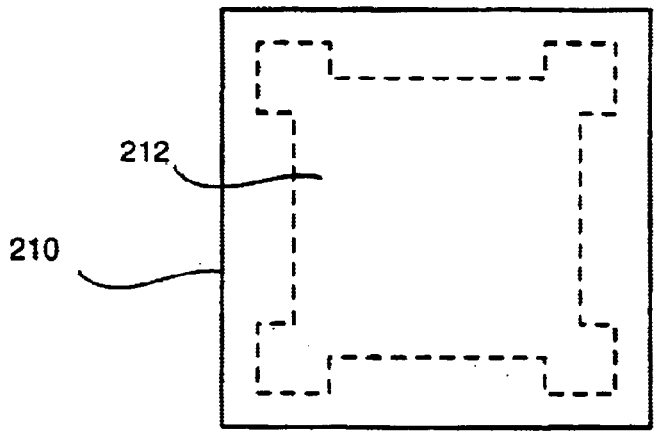
FIG. 6C is a schematic illustration of an absolute difference image constructed in accordance with another embodiment of the disclosed technique.

Reference is further made to FIGS. 6A, 6B and 6C. FIG. 6A is a schematic illustration of window 204 (FIG. 5), including object-image element 192. FIG. 6B is a schematic illustration of a rotated image, generally referenced $204_R$, which is a rotated form of window 204 (FIG. 5), constructed in accordance with a further embodiment of the disclosed technique. FIG. 6C is a schematic illustration of an absolute difference image, generally referenced 210, constructed in accordance with another embodiment of the disclosed technique.

With reference to FIG. 6B, rotated image $204_R$ is formed by rotating window 204 (FIG. 6A) clockwise by angle $\alpha_2$. Rotated image $204_R$ includes a rotated object-image element $192_R$. Rotated object-image element $192_R$ is a rotated form of object-image element 192 (FIG. 6A).

With reference to FIG. 6C, absolute difference image 210 is produced by performing absolute subtraction between window 204 (FIG. 6A) and rotated image $204_R$ (FIG. 6B). Absolute difference image 210 includes a blank region 212.

Blank region 212, object-image element 192, and rotated object-image element $192_R$ have the same geometric locus in absolute difference image 210, in window 204 and in rotated image $204_R$, respectively. Object-image element 192 and rotated object-image element $192_R$ have non-zero intensity. Hence, blank region 212 has zero intensity in absolute difference image 210. To determine whether a defect exists, absolute difference image 210 is examined in a similar procedure as difference image 160 of FIG. 3.

Figure 7A:
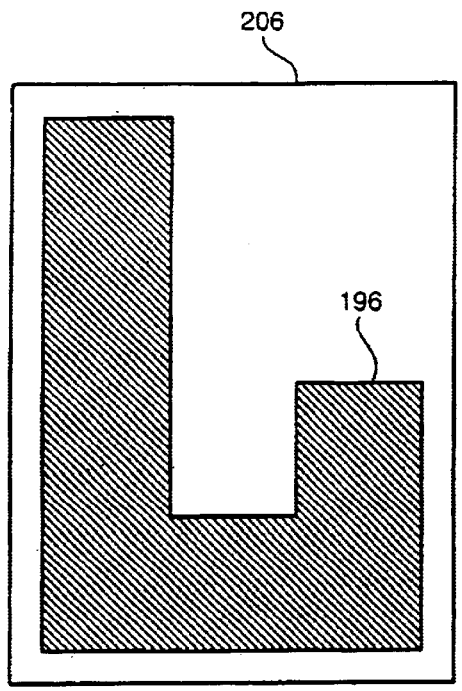
FIG. 7A is a schematic illustration of another window of FIG. 5, including another object-image element.
Figure 7B:
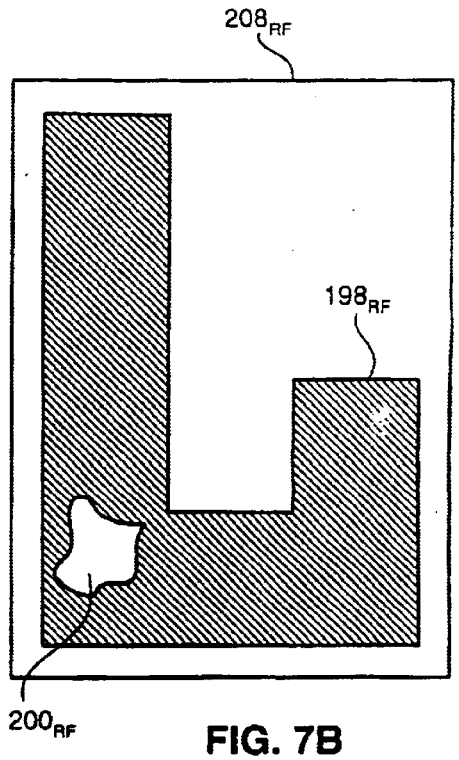
FIG. 7B is a schematic illustration of a manipulated image, which is a manipulated form of yet another window of FIG. 5, constructed in accordance with a further embodiment of the disclosed technique.
Figure 7C:
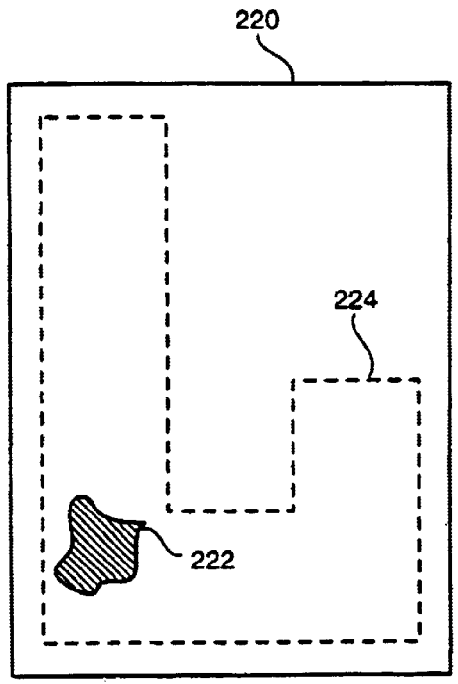
FIG. 7C is a schematic illustration of an absolute difference image, constructed in accordance with another embodiment of the disclosed technique.

Reference is further made to FIGS. 7A, 7B and 7C. FIG. 7A is a schematic illustration of window 206 (FIG. 5), including object-image element 196. FIG. 7B is a schematic illustration of a manipulated image, generally referenced $208_{RF}$, which is manipulated form of window 208 (FIG. 5), constructed in accordance with a further embodiment of the disclosed technique. FIG. 7C is a schematic illustration of an absolute difference image, generally referenced 220, constructed in accordance with another embodiment of the disclosed technique.

With reference to FIG. 7B, manipulated image $208_{RF}$ is formed by rotating window 208 (FIG. 5) clockwise by angle $\beta_2$, and then flipping it horizontally. Manipulated image $208_{RF}$ includes a manipulated object-image element $198_{RF}$. Manipulated object-image element $198_{RF}$ is a rotated and flipped form of object-image element 198 (FIG. 5). Manipulated image $208_{RF}$ further includes a manipulated defect $200_{RF}$. Manipulated defect $200_{RF}$ is a rotated and flipped representation of defect 200 (FIG. 5).

With reference to FIG. 7C, absolute difference image 220 is produced by performing absolute subtraction between window 206 (FIG. 7A) and manipulated image $208_{RF}$ (FIG. 7B). Absolute difference image 220 includes a blank region 224 and a defect region 222.

Blank region 224 has the same geometric locus in window 220 as manipulated object-image element $198_{RF}$ in manipulated window $208_{RF}$. The geometric locus of blank region 224 in window 220 is included in the geometric locus of object-image element 196 in window 206. Object-image element 196 and manipulated object-image element $198_{RF}$ have non-zero intensity. Hence, blank region 224 has zero intensity.

Defect region 222 has the same geometric locus in window 220 as manipulated defect $200_{RF}$ in manipulated image $208_{RF}$. The geometric locus of defect region 224 in absolute difference image 220 is contained in the geometric locus of object-image element 196 in window 206. Object-image element 196 has non-zero intensity. Manipulated defect $200_{RF}$ has zero intensity. Hence, defect region 224 has non-zero intensity.

Absolute difference image 220 is examined, so as to determine whether a defect exists, in a similar procedure as applied on difference image 160 of FIG. 3.

Figure 8A:
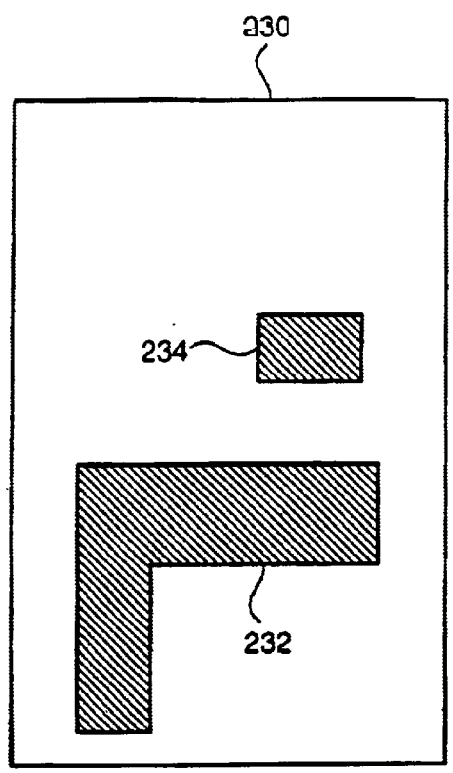
FIG. 8A is a schematic illustration of a bottom layer database-image.
Figure 8B:
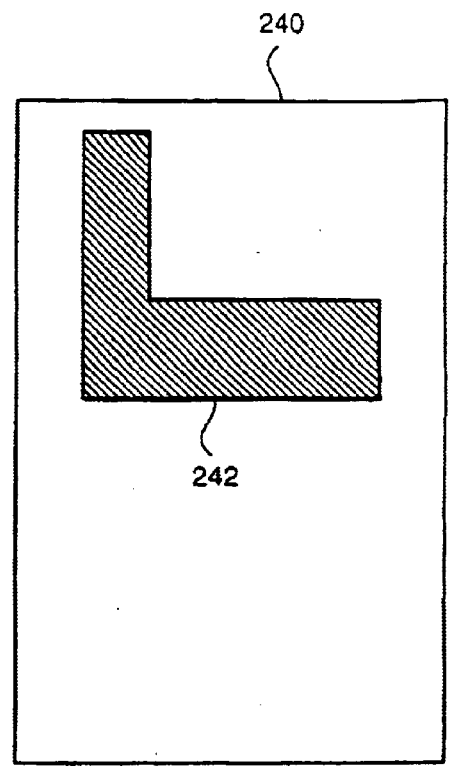
FIG. 8B is a schematic illustration of a top layer database-image.
Figure 8C:
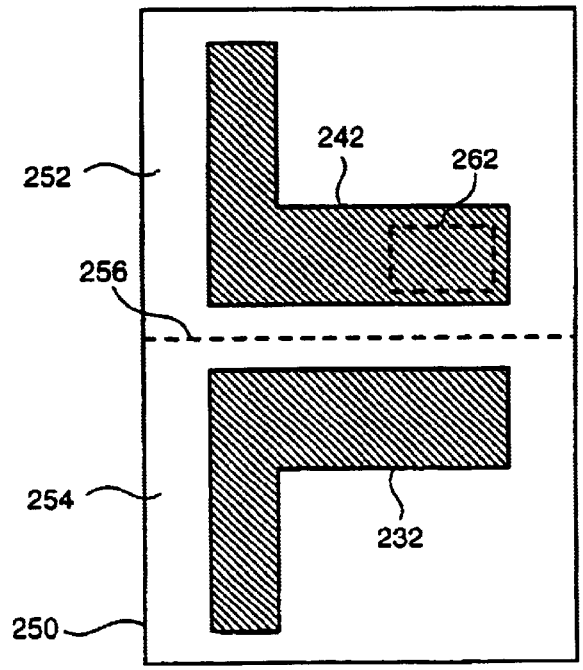
FIG. 8C is a schematic illustration of a combined database-image.

According to another aspect of the disclosed technique, a symmetry based defect detection procedure is applied on a combination of layers, which exhibit symmetry together, but do not necessarily exhibit symmetry individually. Reference is now made to FIGS. 8A, 8B and 8C. FIG. 8A is a schematic illustration of a bottom layer database-image window, generally referenced 230. FIG. 8B is a schematic illustration of a top layer database-image, generally referenced 240. FIG. 8C is a schematic illustration of a combined database-image, generally referenced 250.

With reference to FIG. 8A, bottom layer database-image 230 represents a predetermined circuit pattern which is to be imprinted on the bottom layer of two-layer object. Bottom layer database-image 230 includes database-image elements 232 and 234, dispensed at different locations therein.

With reference to FIG. 8B, top layer database-image 240 represents a predetermined circuit pattern which is to be imprinted as the top layer of two-layer object, on top of an already printed bottom layer. Top layer database-image 240 includes a database-image element 242.

With reference to FIG. 8C, combined database-image 250 represents the image formed by bottom layer database-image 230 (FIG. 8A) and top layer database-image 240 (FIG. 8B). Combined database-image 250 includes database-image elements 232 and 242. A region 262 within database-image element 242, has the same geometric locus as image element 234 in bottom layer database-image 230 (FIG. 8A). It is noted that region 262 does not appear on the actual database-image, since database-image element 242 conceals database-image element 234.

A horizontal symmetry-line 256 splits combined database-image 250 into an upper database-image section 252 and a lower database-image section 254, having equal areas. Combined database-image 250 is symmetrical with respect to symmetry-line 256.

Figure 9:
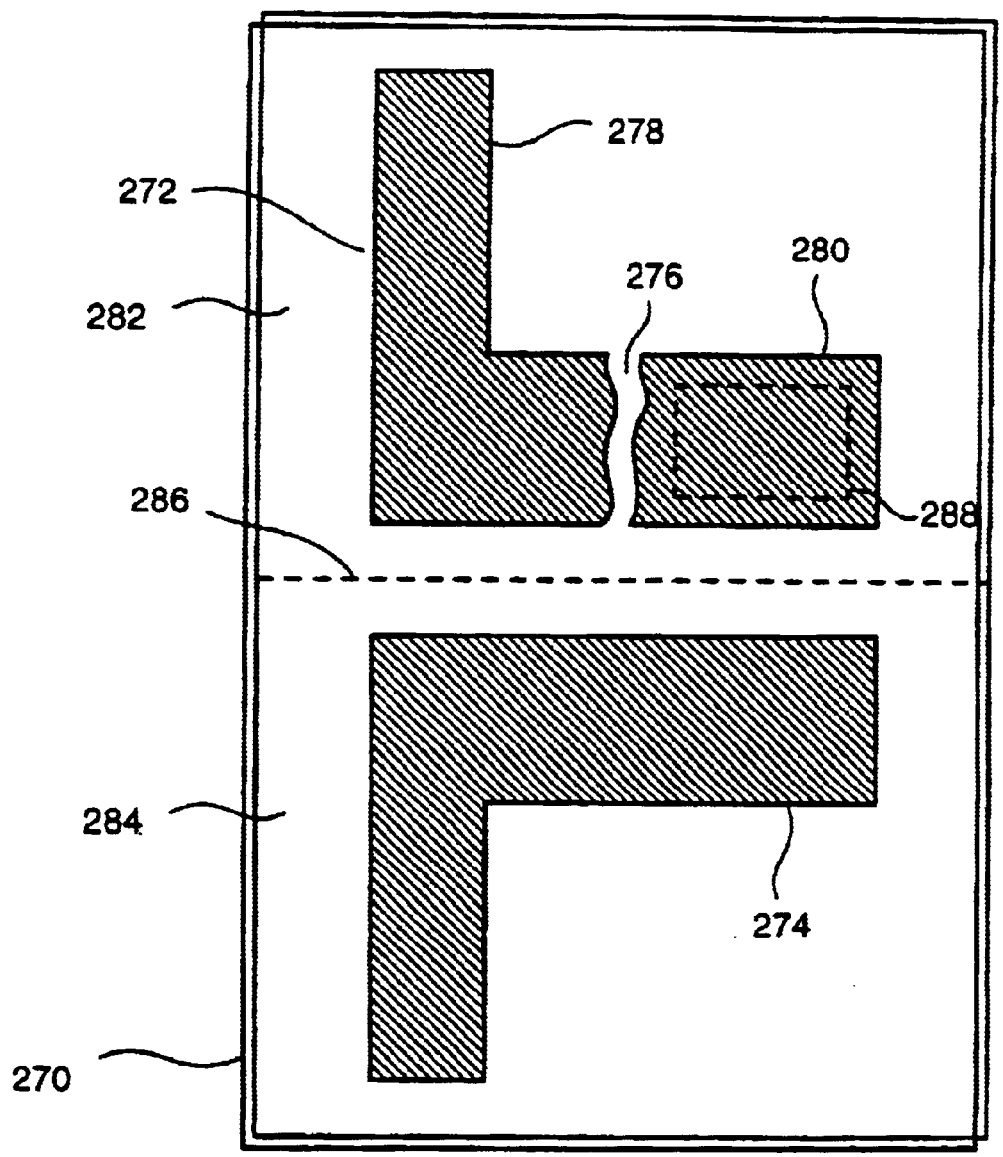
FIG. 9 is a schematic illustration of an object-image representing a two-layer physical object.

Reference is further made to FIG. 9, which is a schematic illustration of an object-image, generally referenced 270, representing a two-layer physical object. Object-image 270 includes object-image elements 272 and 274 dispensed at different locations therein. Object-image elements 272 and 274 are represented in combined database-image 250 (FIG. 8C) by database-image elements 232 and 242, respectively. Object-image 270 further includes a defect 276, which is a crack in object-image element 272. In the present example, the area defined by defect 276 should have been of the same properties as object-image element 198. Defect 276 divides object-image element 272 into first object-image element portion 278 and second object-image element portion 280.

A region 288 is indicated within object-image element portion 280. Region 288 is the geometric locus of the object-image element represented by image element 234 in bottom layer database-image 230 of FIG. 8A. It is noted that region 288 does not appear on the actual object-image, since object-image element portion 280 of object-image element 272 conceals the object-image element in region 288.

A horizontal symmetry-line 286 divides object-image 270 into an upper object-image section 282 and a lower object-image window 284, having the same area. Upper object-image section 282 and lower object-image window 284 are represented by upper database-image section 252 and lower database-image section 254, respectively, in combined database-image 250 (FIG. 8C). Accordingly, the sizes and positions of upper object-image section 282 and lower object-image window 284 may be derived from the sizes and positions of upper database-image section 252 and lower database-image section 254, respectively. Since combined database-image 250 is symmetrical with respect to symmetry-line 256, object-image 270 should be symmetrical with respect to symmetry-line 286, assuming no defects are present.

Figure 10A:
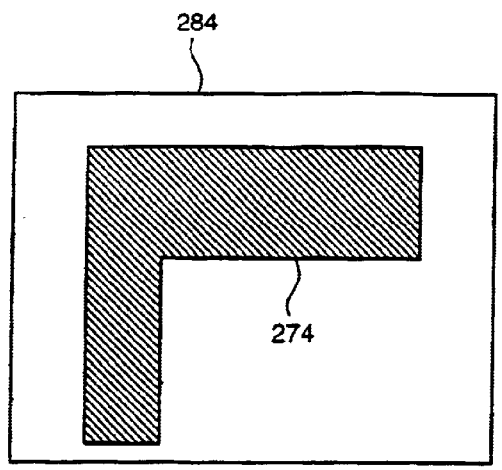
FIG. 10A is a schematic illustration of the lower object-image window of FIG. 9, including the object-image element of FIG. 9.
Figure 10B:
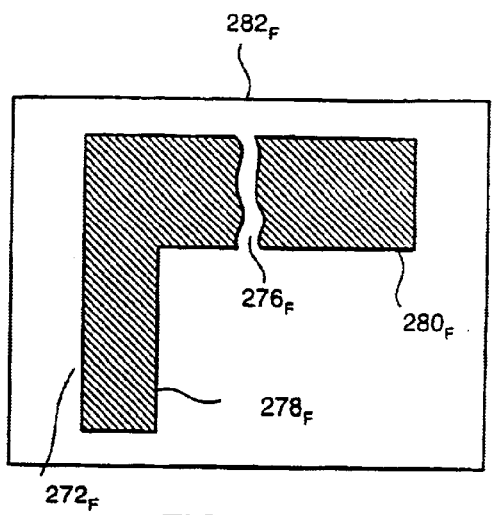
FIG. 10B is a schematic illustration of a flipped image, which is a flipped form of the upper object-image window of FIG. 9, constructed in accordance with a further embodiment of the disclosed technique.
Figure 10C:
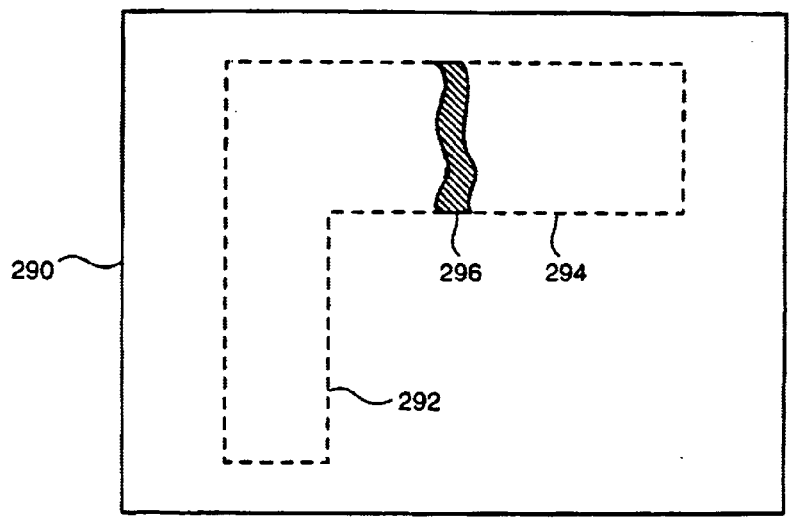
FIG. 10C is a schematic illustration of an absolute difference image, constructed in accordance with another embodiment of the disclosed technique.

Reference is further made to FIGS. 10A, 10B and 10C. FIG. 10A is a schematic illustration of lower object-image window 284, including object-image element 274 (FIG. 9). FIG. 10B is a schematic illustration of a flipped image, generally referenced $282_F$, which is a flipped form of upper object-image window 282 (FIG. 9), constructed in accordance with a further embodiment of the disclosed technique. FIG. 10C is a schematic illustration of an absolute difference image, generally referenced 290, constructed in accordance with another embodiment of the disclosed technique.

With reference to FIG. 10B, flipped image $282_F$ is formed by vertically flipping object-image section 282 (FIG. 8C). Flipped image $282_F$ includes flipped object-image element $272_F$. Flipped object-image element $272_F$ is a flipped form of object-image element 272 (FIG. 8C). Flipped image $282_F$ further includes a flipped defect $276_F$. Flipped defect is a flipped form of defect 276 (FIG. 8C). Flipped defect $276_F$ divides flipped object-image element $272_F$ into flipped object-image element-portions $278_F$ and $280_F$, which are flipped forms of object-image element-portions 278 and 280 (FIG. 8C), respectively.

With reference to FIG. 10C, absolute difference image 290 is produced by performing absolute subtraction between object-image window 284 (FIG. 10A) and flipped image $282_F$ (FIG. 10B). Absolute difference image 290 includes blank regions 292 and 294 and a defect region 296. Blank regions 292 and 294 have the same geometric locus in absolute difference image 290 as flipped components $278_F$ and $280_F$ in flipped image $282_F$, respectively. The geometric locus of blank regions 292 and 294 is contained in the geometric locus of object-image element 274 in object-image window 284 (FIG. 10A). Flipped object-image element portions $278_F$ and $274_F$ and object-image element 274 have non-zero intensities. Hence, blank regions 292 and 294 have zero intensity. Defect region 296 has the same geometric locus as flipped defect $276_F$ in flipped image $282_F$ (FIG. 10B). Defect region 296 is contained in the geometric locus of object-image element 274 in object-image window 284. Flipped defect $276_F$ has zero intensity. Object-image element 274 has non-zero intensity. Hence, defect region 296 has non-zero intensity in absolute difference image 290. Absolute difference image 290 is examined, so as to determine whether a defect exists, in a similar procedure as applied on difference image 160 of FIG. 3.

Figure 11:
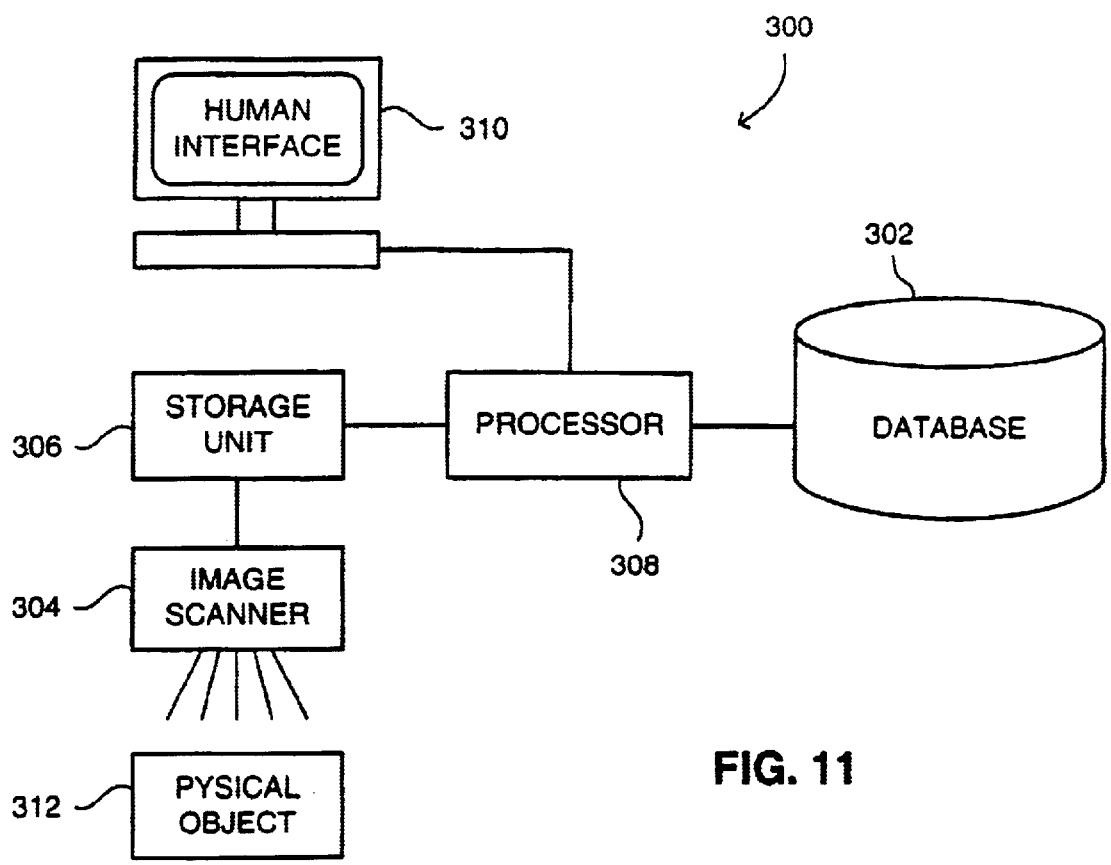
FIG. 11 is a schematic illustration of a defect detection system, constructed and operative in accordance with a further embodiment of the disclosed technique.

Reference is now made to FIG. 11, which is a schematic illustration of a defect detection system, generally referenced 300, constructed and operative in accordance with a further embodiment of the disclosed technique. System 300 includes a database 302, an image scanner 304, a storage unit 306, a processor 308 and a human interface 310.

Processor 308 is coupled with human interface 310, with storage unit 306 and with database 302. Image scanner 304 is coupled with storage unit 306 and with a physical object 312. Inspected physical object 312 can be a photomask, a reticle die, fabric, and the like.

Database 302 contains image data of a database-image which should have been imprinted on inspected physical object 312. Processor 308 retrieves the database-image from database 302 and analyzes it so as to determine symmetry properties thereof. It is noted that the analysis results can be stored in database 302 in association with the original database-image.

Image scanner 304 optically scans physical object 312, produces a respective database-image and stores the object-image in storage unit 306. Processor 308 applies a defect analysis procedure on the object-image stored in storage unit 306, according to the symmetry analysis of the database-image. The defect analysis procedure includes several stages such as aligning the object-image and the database-image, locating areas which should exhibit symmetry and determining if these areas do exhibit that symmetry, thereby indicating probable defects.

Figure 12:
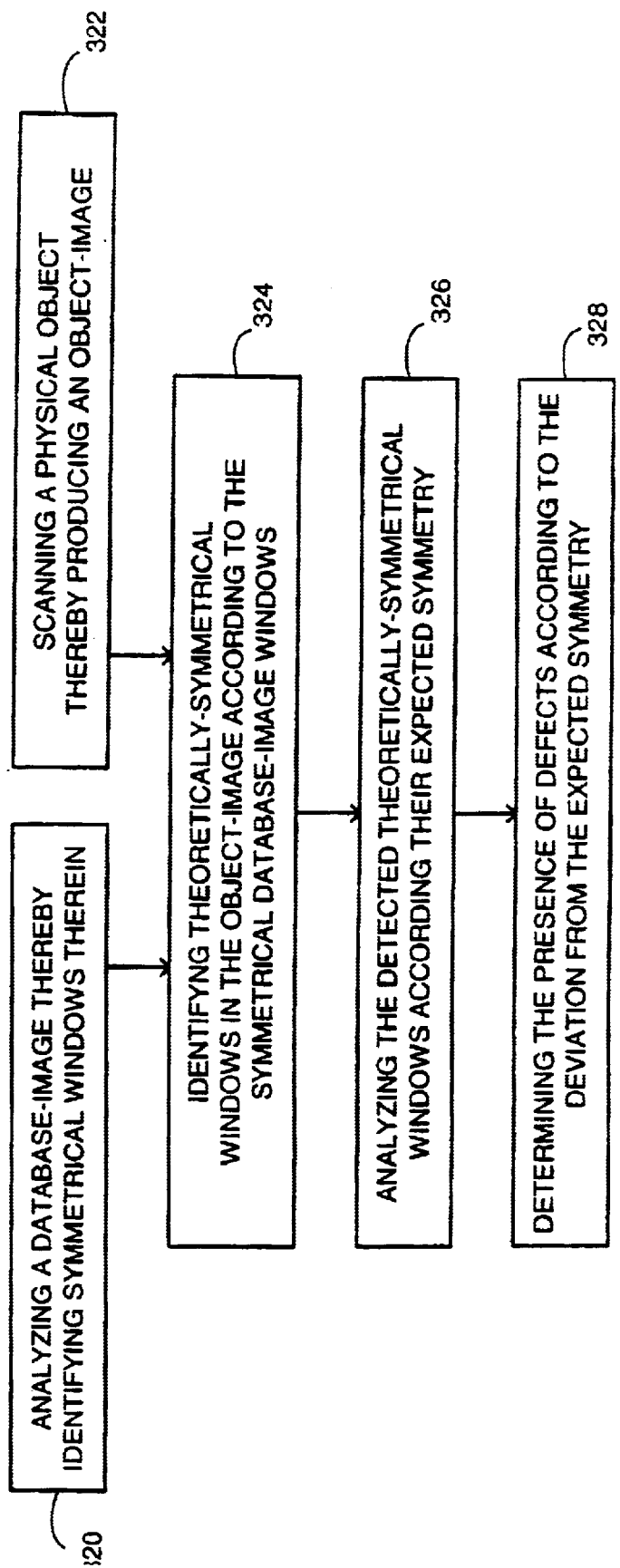
FIG. 12 is a schematic illustration of a method for operating the system of FIG. 11, operative in accordance with another embodiment of the disclosed technique.

Reference is further made to FIG. 12, which is a schematic illustration of a method for operating system 300 of FIG. 11, operative in accordance with another embodiment of the disclosed technique. In procedure 320, a database-image is analyzed, thereby identifying symmetrical windows therein. The symmetrical database-image windows are windows exhibiting symmetry of various types or a combination thereof, either individually or when considered as a group of windows. For example, with reference to FIGS. 1 and 4, database-image window 140 (FIG. 1) exhibits axial symmetry individually, while windows 186 and 188 (FIG. 4) exhibit axial-rotational symmetry when considered as a pair of windows. The example shown in FIG. 5 of window 181, involves rotational symmetry of 180 degrees about axis 183. It will be appreciated that rotational symmetry is not confined in general to 90 or 180 degrees and in other contexts can relate to symmetries that require non-rectangular symmetrical regions or windows. It is also noted that symmetries can relate to mere portions of object-images, whereby the rest of the object-image is not manipulated for symmetry quest. For example, in a case wherein the shape of the element is a circle, there exist an infinite number of rotational symmetries. Similarly, a regular polygon of order of N, defines N-1 different rotational symmetries, 360/N degrees apart.

In the example set forth in FIG. 11, processor 308 receives a database-image from database 302 and identifies symmetrical windows therein, using methods known in the art for identification of symmetry in an image. Processor 308 stores the coordinates of the detected symmetry-windows, and other data associated with the symmetry properties thereof, in storage unit 306. Alternatively, database 302 may already contain the symmetry data (i.e., the coordinates and symmetry properties of the symmetrical elements or regions). In this case, processor 308 retrieves the symmetry data from database 302.

In procedure 322, a physical object is scanned, thereby producing an object-image. In the example set forth in FIG. 11, image scanner 304 optically scans physical object 312. System 300 can store the acquired object-image in storage unit 306. The object-image can be a color bitmap, a gray-scale bitmap, a binary bitmap, compressed according to any of a variety of image compression formats, and the like.

In procedure 324, theoretically-symmetrical windows are identified in the object-image according to the symmetrical database-image windows. The coordinates of the theoretically-symmetrical windows are determined from the coordinates of their respective database-image symmetrical window. In the example set forth in FIGS. 1 and 2, object-image window 140 is identified as a theoretically-symmetrical window, its coordinates derived from the coordinates of database-image window 110

In procedure 326, the detected theoretically-symmetrical windows are analyzed according to their expected symmetry. In the example set forth in FIGS. 2, 3A, 3B and 3C, window 140 (FIG. 2) is analyzed by producing difference image 160 (FIG. 3C) and detecting non-zero regions therein.

In procedure 328, the presence of defects is determined, according to the deviation from the expected symmetry. The result of the analysis form procedure 326 is compared to a predetermined threshold or thresholds. If the deviation from the expected symmetry exceeds the predetermined threshold, the defect detection system declares a suspected defect. Otherwise, the system may proceed to other defect detection methods or to other symmetrical windows.

It is noted that the method illustrated in FIG. 12 may be repeated more than once, and procedures thereof may be repeated or performed in different orders or in parallel. For example, with reference to FIG. 11, image scanner 300 may inspect physical object 312 dynamically (i.e., in a case wherein storage unit and 306 and processor 308 do not have the memory space or processing power required to store and analyze the entire database-image and object-image). Accordingly, at each stage of the procedure, image scanner 304 scans a portion of physical object 312 and stores the scanned image portion as the object-image in storage unit 306. Processor 308 retrieves a respective portion of the image from database 302, as the database-image. Processor 308 performs an inspection on the stored object-image. Image scanner 304 then proceeds to scan another portion of physical object 312.

According to another aspect of the disclosed technique, symmetrical database-image windows are identified using symmetrical database-image elements. Accordingly, symmetrical database-image elements are initially identified, and symmetrical windows are then identified according to these symmetrical database-image elements.

Figure 13:
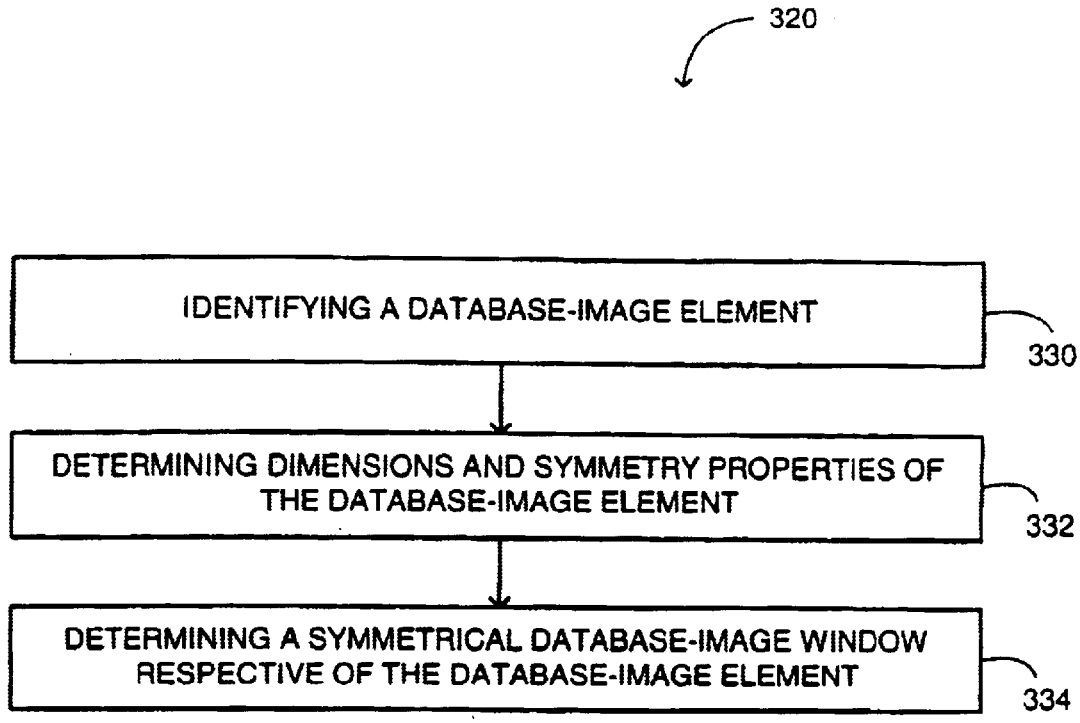
FIG. 13 is an illustration in detail of the database-image analysis procedure of the method of FIG. 12, according to a further embodiment of the disclosed technique.

Reference is now made to FIG. 13, which is an illustration in detail of procedure 320 of the method of FIG. 12, according to a further embodiment of the disclosed technique. It is noted that the method of FIG. 13 is discussed herein below in the context of detecting symmetry of a single database-image element, but an analogous method may be applied with reference to detecting symmetry of groups of database-image elements. Accordingly, groups of database-image elements which exhibit symmetry when considered as a group, are initially identified, and respective groups of symmetrical windows can then be derived there from. Furthermore, a combination of single-element and element-group symmetry detection methods may be applied.

The method of FIG. 13 is discussed herein below in the context of a pixel-map database-image. A pixel-map image is an image represented by a two-dimensional array of pixels and their respective visual properties (e.g., intensity values, chrominance values, and the like), such-as a gray-scale map, a binary bitmap, a color map, and the like. For demonstrative purposes, the images discussed in the context of the disclosed technique are monochromatic (i.e., gray scale or binary pixel maps). It is noted, however, that the database-image may be stored in various formats. For example, the database-image may be stored as an element-map, including a list of elements, their coordinates and their properties. It is still further noted that the method of FIG. 13 and procedures thereof may further include additional procedures such as smoothing the database-image for noise reduction, converting the database-image to a different format (e.g., converting to pixel, raster or vector representations, changing the resolution, intensity spectrum, pixel size, or color representation), and the like. The method of FIG. 13 procedures thereof may be repeated more than once, and procedures thereof may be performed in different orders or in parallel.

In procedure 330, a database-image element is identified. The element is identified using methods known in the art for identification of image elements in a pixel-map. For example, the closed shapes in the database-image, or the regions of continuous intensity, may be identified as the database-image elements.

In procedure 332, dimensions and symmetry properties of the database-image element are determined. The element is tested, using methods for symmetry detection, to determine the type of symmetry exhibited (e.g., horizontal, vertical, rotational symmetry, or a combination thereof) and the parameters associated therewith (e.g., the coordinates of the symmetry-line or the angle of rotation). It is noted that the dimensions of the database-image element may already be known, whereby only the symmetry properties thereof are determined. Alternatively, the symmetry properties of the element may already be known, in which case only the dimensions thereof are determined. It is further noted that procedure 332 may further include determining other properties of the database-image element, such as color representation and intensity spectrum.

In procedure 334, a symmetrical database-image window respective of the database-image element, is identified. The symmetrical database-image window includes at least a portion of the database-image element and regions adjacent thereto, and exhibits the same symmetry properties as the respective database-image element. It is noted that procedure 334 is required only for those elements that exhibit some kind of symmetry.

The coordinates of the symmetrical database-image window are determined according to the coordinates and the properties of the database-image element, and according to predetermined criteria. For example, the symmetrical database-image window may be defined as the largest possible window enclosing the database-image element and exhibiting the detected symmetry properties.

Figure 14:
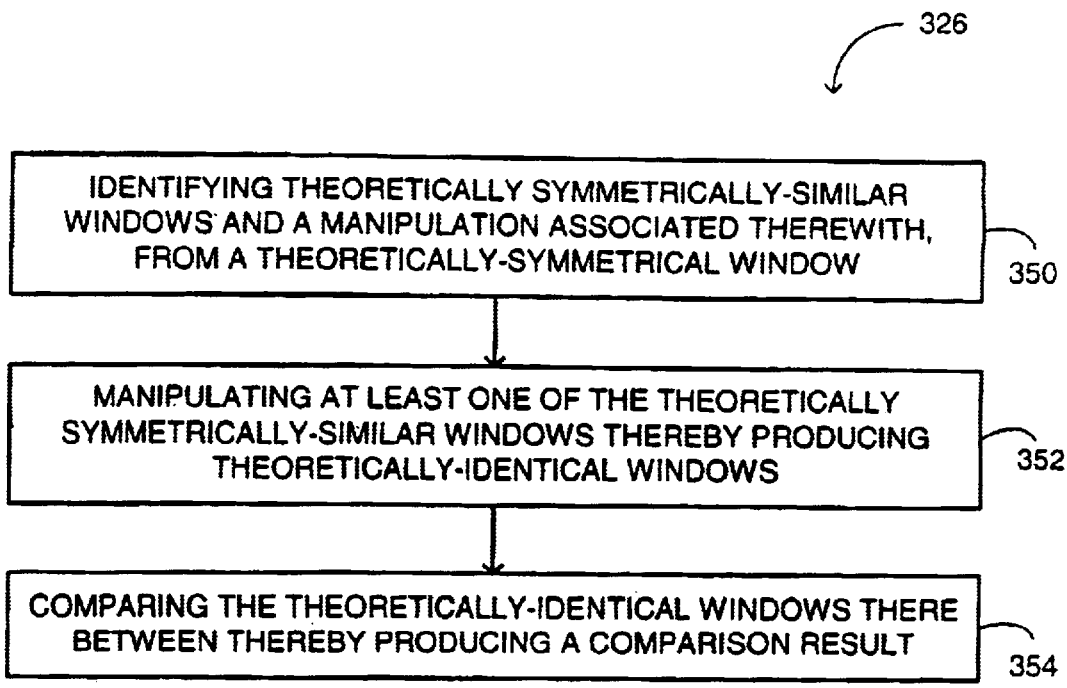
FIG. 14 is an illustration in detail of the procedure of analyzing theoretically-symmetrical windows, of the method of FIG. 12, in accordance with another embodiment of the disclosed technique.

Reference is now made to FIG. 14, which is an illustration in detail of procedure 326 of the method of FIG. 12, in accordance with another embodiment of the disclosed technique. It is noted that the procedure of FIG. 14 is repeated a plurality of times, once for each theoretically-symmetrical window or group of windows. It further is noted that the procedure of FIG. 14 is discussed in the context of database-image windows exhibiting symmetry individually, and their respective theoretically-symmetrical windows. It is noted that an analogous procedure may be applied for testing symmetry in groups of windows.

In procedure 350, theoretically symmetrically-similar windows and a manipulation associated therewith, are identified from a theoretically-symmetrical window. In the example set forth in FIG. 2, left window-section 144 and right window-section 146 are identified as theoretically symmetrically-similar regions, and the manipulation associated therewith is identified as horizontal flipping. In the example set forth in FIG. 5, object-image window 211 is identified as exhibiting symmetrical-similarity relative to itself, according to a manipulation which is identified as rotation by 180 degrees.

In procedure 352, at least one of the theoretically symmetrically-similar windows, is manipulated, thereby producing theoretically-identical windows. The theoretically symmetrically-similar windows are manipulated according to the manipulation associated with the expected similarity thereof. In the example set forth in FIGS. 2, 3A and 3B, the image of left window-section 144 and flipped image $146_F$, which are theoretically-identical images, are produced from window-sections 144 and 146, which are theoretically symmetrically-similar regions.

In procedure 354, the theoretically-identical windows are compared there between, thereby producing a comparison result. The comparison result indicates the extent to which the theoretically symmetrically-identical windows are actually identical. Hence, the comparison result indicates to what extent the theoretically-symmetrical window is actually symmetrical. With reference to FIGS. 3A, 3B and 3C, difference image 160 is produced from theoretically-identical images 144 and 146, and the presence of non-zero regions therein is detected.

It is noted that procedures 352 and 354 may be incorporated in a single procedure, wherein the manipulation is performed mathematically, and the comparison is made directly between respective pixels of the theoretically symmetrically-similar windows, without producing theoretically-identical windows.

According to another aspect of the disclosed technique, the theoretically-symmetrical window and the respective theoretically symmetrically-similar windows are identified in the object-image in an optimization process. The process involves finding object-image windows, which approximate the theoretically-symmetrical windows, and refining this approximation. The optimization process yields an optimal symmetry-testing window, which may then be identified as a theoretically-symmetrical window. In the examples that follow, the optimization procedure determines only the coordinates of the theoretically-symmetrical windows. It is noted, however, that other properties of the theoretically-symmetrical windows may be determined. For example, the coordinates of the theoretically symmetrically-similar windows respective of the theoretically-symmetrical windows may be determined in a similar optimization process.

Figure 15A:
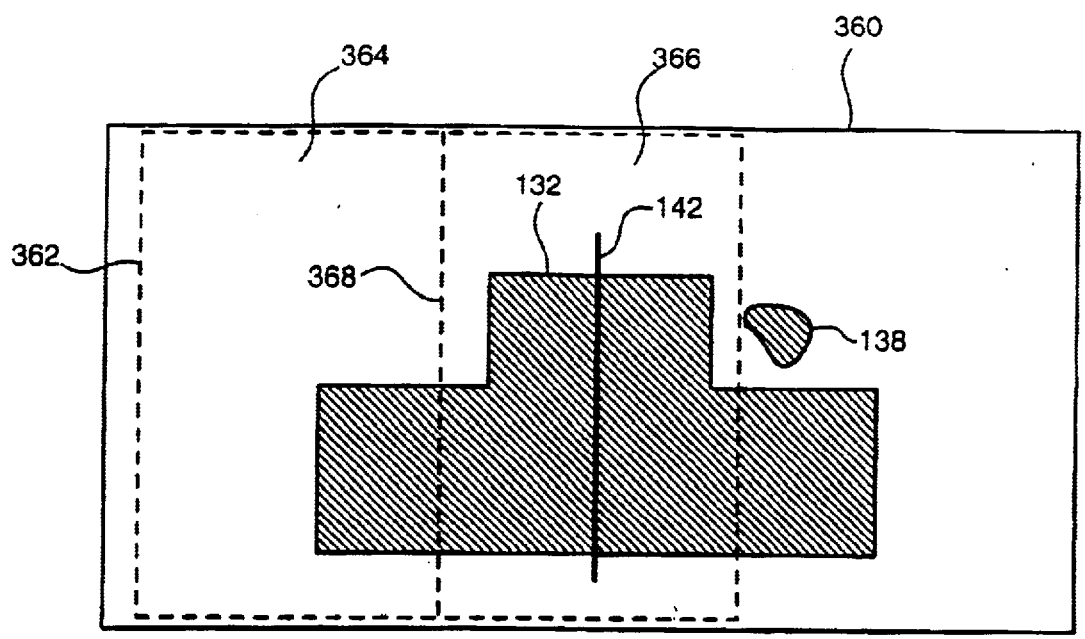
FIG. 15A is a schematic illustration of a region, taken from the object-image of FIG. 2, including a symmetry-testing window.
Figure 15B:
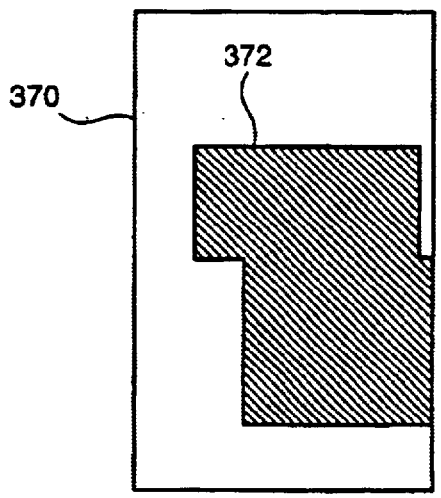
FIG. 15B is a schematic illustration of an absolute difference image, produced according to the symmetry-testing window of FIG. 15A.
Figure 15C:
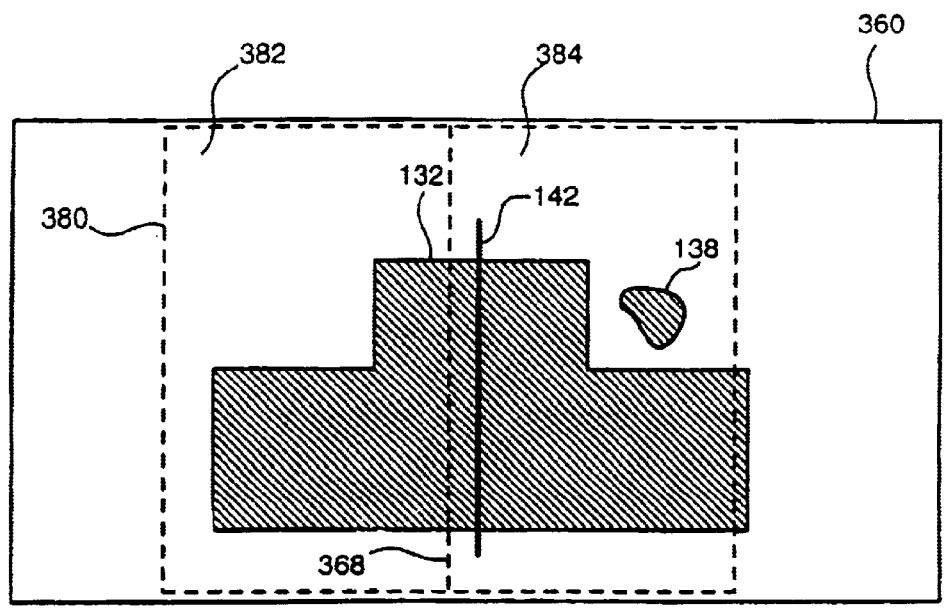
FIG. 15C is a schematic illustration of the region of FIG. 15A, including another symmetry-testing window.
Figure 15D:
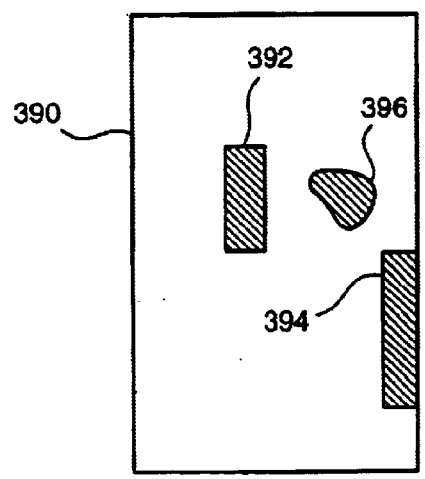
FIG. 15D is a schematic illustration of an absolute difference image, produced according to the symmetry-testing window of FIG. 15C.
Figure 15E:
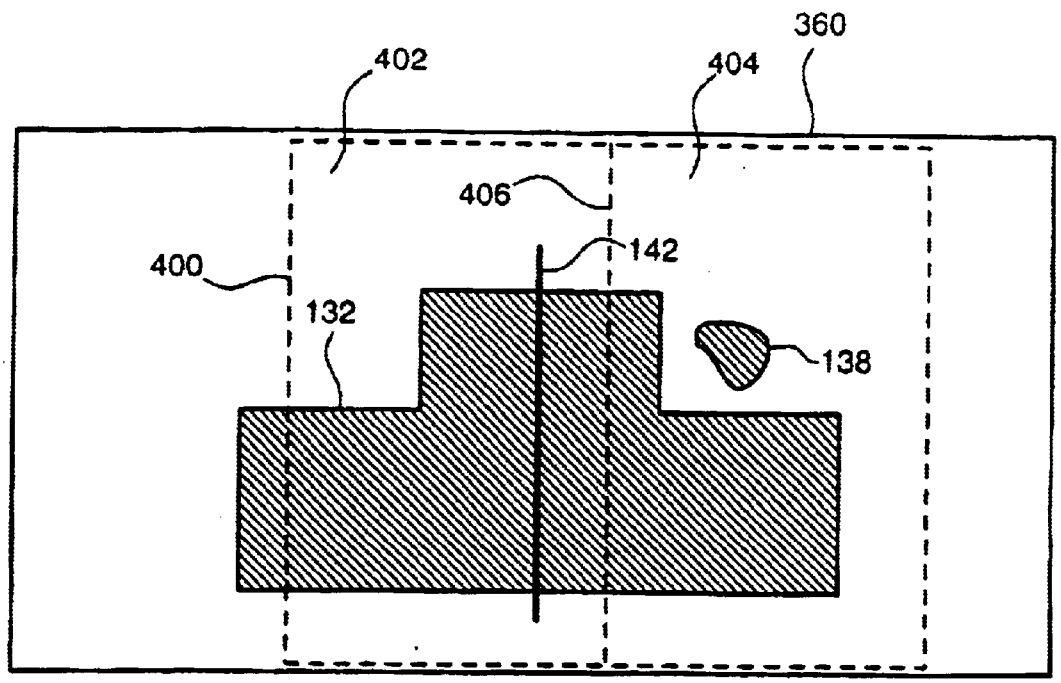
FIG. 15E is a schematic illustration of the region of FIG. 15A, including another symmetry-testing window.
Figure 15F:
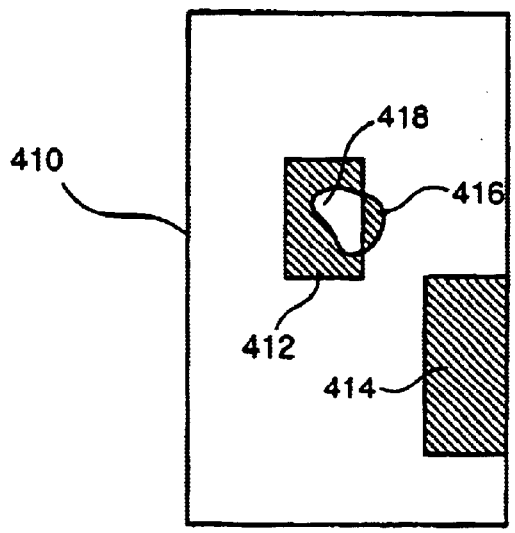
FIG. 15F is a schematic illustration of an absolute difference image, produced according to the symmetry-testing window of FIG. 15E.
Figure 15G:
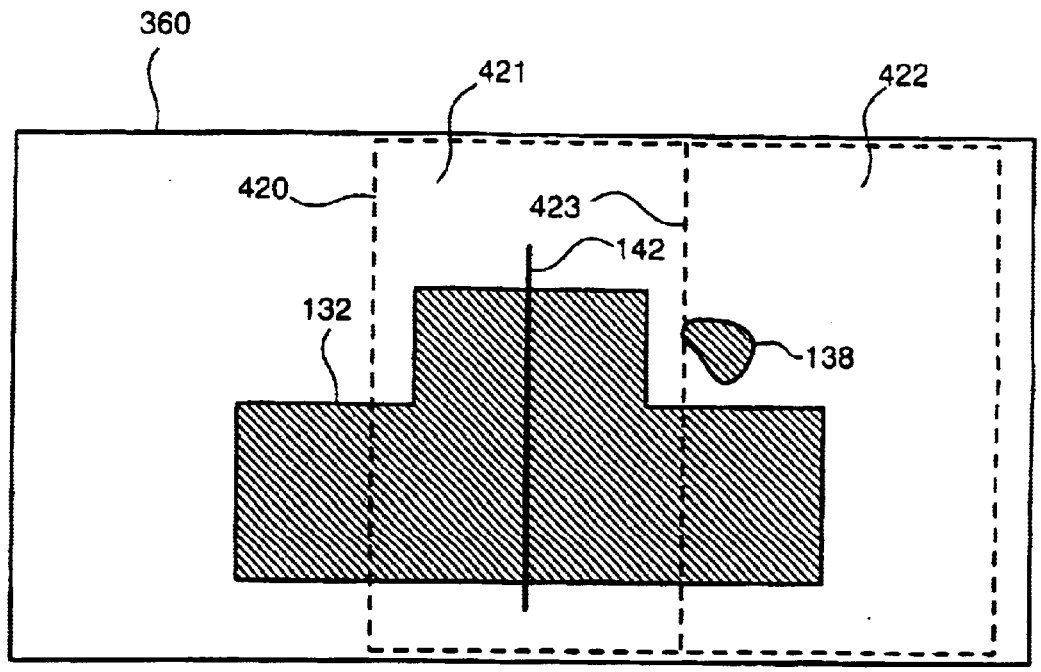
FIG. 15G is a schematic illustration of the region of FIG. 15A, including another symmetry-testing window.
Figure 15H:
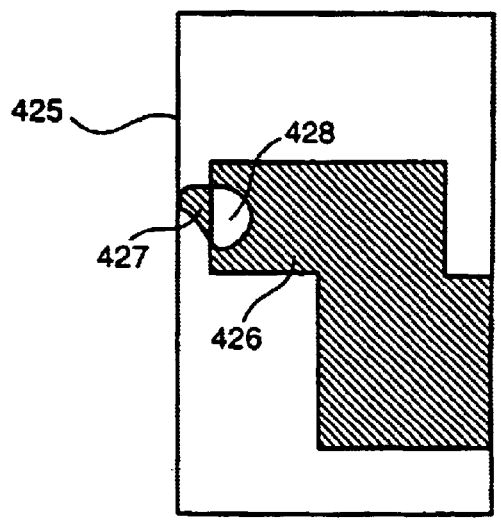
FIG. 15H is a schematic illustration of an absolute difference image, produced according to the symmetry-testing window of FIG. 15G.
Figure 15I:
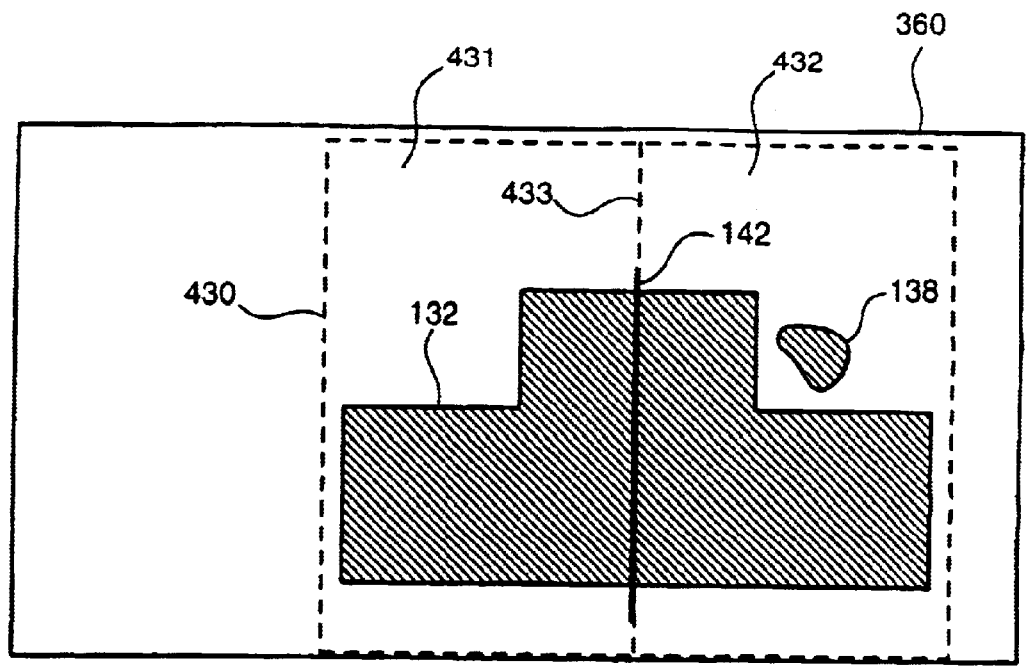
FIG. 15I is a schematic illustration of the region of FIG. 15A, including a symmetry-testing window 430, which exhibits the best achieved symmetry.
Figure 15J:
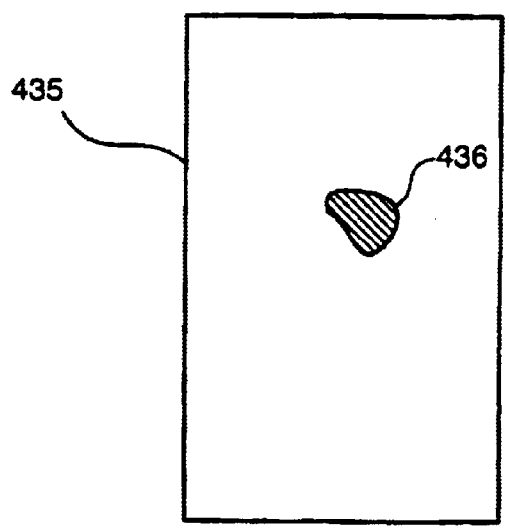
FIG. 15J is a schematic illustration of an absolute difference image, produced according to the symmetry-testing window of FIG. 15J.

Reference is now made to FIGS. 15A, 15B, 15C, 15D, 15E, 15F, 15G, and 15H. FIG. 15A is a schematic illustration of a region, generally referenced 360, taken from object-image 130 of FIG. 2, including a symmetry-testing window 362. FIG. 15B is a schematic illustration of an absolute difference image, generally referenced 370, produced according to symmetry-testing window 362 (FIG. 15A). FIG. 15C is a schematic illustration of region 360 (FIG. 15A), including a symmetry-testing window 380. FIG. 15D is a schematic illustration of an absolute difference image, generally referenced 390, produced according to symmetry-testing window 380 (FIG. 15C). FIG. 15E is a schematic illustration of region 360 (FIG. 15A), including a symmetry-testing window 400. FIG. 15F is a schematic illustration of an absolute difference image, generally referenced 410, produced according to symmetry-testing window 400 (FIG. 15E). FIG. 15G is a schematic illustration of region 360 (FIG. 15A), including a symmetry-testing window 420. FIG. 15H is a schematic illustration of an absolute difference image, generally referenced 425, produced according to symmetry-testing window 420 (FIG. 15G). FIG. 15I is a schematic illustration of region 360 (FIG. 15A), including a symmetry-testing window 430, which exhibits the best achieved symmetry. FIG. 15J is a schematic illustration of an absolute difference image, generally referenced 435, produced according to symmetry-testing window 430 (FIG. 15I).

With reference to FIG. 15A, region 360 includes object-image element 132, defect 138 (FIG. 2) and symmetry-testing window 362. Symmetry-testing window 362 is tested for horizontal symmetry. Object-image element 132 is symmetrical with respect to symmetry-line 142 (FIG. 2). A symmetry-line 368 splits symmetry testing window 362 into left window-section 364 and right symmetry-window 366. Left and right window-sections 364 and 366 have equal areas. Symmetry-line 368 is significantly displaced to the left from symmetry-line 142, and hence, symmetry-testing window 362 is not symmetrical with respect to symmetry-line 368.

With reference to FIG. 15B, absolute difference image 370 is produced by performing an operation of absolute subtraction between right window-section 366 (FIG. 15A) and a horizontally flipped form (not shown) of left window-section 364, in a procedure similar to the procedure illustrated in FIGS. 3A, 3B and 3C. Absolute difference image 370 includes a non-zero region 372. With reference to FIG. 15A, the geometric locus of non-zero region 372 in absolute difference image 370 is included in the geometric locus of object-image element 132 in right window-section 366. Since the respective region in the flipped form of left window-section 364 has zero intensity, non-zero region 372 has non-zero intensity, indicating an asymmetry in symmetry-testing window 362.

With reference to FIG. 15C, region 360 includes object-image element 132, defect 138 (FIG. 2) and symmetry-testing window 380. Symmetry-testing window 380 is displaced to the right by one length unit relative to symmetry testing window 362 (FIG. 15A) in region 360. For example, the length unit may be the length of a single pixel.

Symmetry-testing window 380 is tested for horizontal symmetry. A symmetry-line 386 splits symmetry-testing window 380 into left window-section 382 and right window-section 384, which have equal areas. Symmetry-line 386 is slightly displaced to the left from symmetry-line 142.

With reference to FIG. 15D, absolute difference image 390 is produced by performing an operation of absolute subtraction between right window-section 384 (FIG. 15A) and a horizontally flipped form (not shown) of left window-section 382 (FIG. 15A). Absolute difference image 390 includes non-zero regions 392, 394 and a defect region 396. Non-zero regions 392 and 394 and defect region 396 have non-zero intensities. With reference to FIG. 15C, non-zero regions 392 and 394 have the same geometric locus in absolute difference image 390 as portions of image element 132 in right window-section 384. Since the respective regions in the horizontally flipped form of left window-section 382 have zero intensity, regions 392 and 394 have non-zero intensity. Defect region 396 has the same geometric locus in absolute difference image 390 as defect 138 in right window-section 384. Since the respective region in the horizontally flipped form of left window-section 382 has zero intensity, defect region 396 has non-zero intensity.

The presence of non-zero regions 392 and 394 and defect region 396 in absolute difference image 390 indicates an asymmetry in symmetry-testing window 380. However, the combined area of non-zero regions 392 and 394 and defect region 396 in absolute difference image 390 is significantly smaller than the area of non-zero region 372 in absolute difference image 370 (FIG. 15B). This indicates that symmetry-testing window 380 is significantly closer to being horizontally symmetrical than symmetry-testing window 362 (FIG. 15A).

With reference to FIG. 15E, region 360 includes object-image element 132, defect 138 (FIG. 2) and symmetry-testing window 400. Symmetry-testing window 400 is displaced to the right by one length unit relative to symmetry testing window 380 (FIG. 15C) in region 360. Symmetry-testing window 400 is tested for horizontal symmetry. A symmetry-line 406 splits symmetry-testing window 400 into left window-section 402 and right window-section 404, which have equal areas. Symmetry-line 406 is slightly displaced to the right from symmetry-line 142.

With reference to FIG. 15F, absolute difference image 410 is produced by performing an operation of absolute subtraction between right window-section 404 (FIG. 15A) and a horizontally flipped form (not shown) of left window-section 402 (FIG. 15A). Absolute difference image 410 includes non-zero regions 412, 414, a non-zero defect region 416, and a blank defect region 418. With reference to FIG. 15E, the geometric locus of non-zero regions 412 and 414, is included in the geometric locus of object-image element 132 in left window-section 402. The respective region in right window-section 404 has zero intensity, and hence, regions 412 and 414 have non-zero intensity. The geometric locus of non-zero defect region 416 is included in the geometric locus of defect 138 in right window-section 404. The respective region in left window-section 402 has zero intensity, and hence, non-zero defect region has non-zero intensity. The geometric locus of blank defect-region is included in the geometric locus of object-image element 132, but is also included in the geometric locus of defect 138 in right window-section 404, and hence, blank defect-region 418 has zero intensity.

The presence of non-zero regions 412, 414 and 416 in absolute difference image 410 indicates an asymmetry in symmetry-testing window 400. The combined area of non-zero regions 412 is larger than the combined area of non-zero regions 392, 394 and 396 in absolute difference image 390 (FIG. 15D). This indicates that symmetry-testing window 380 is closer to being horizontally symmetrical than symmetry-testing window 400 (FIG. 15C).

With reference to FIG. 15G, region 360 includes object-image element 132, defect 138 (FIG. 2) and symmetry-testing window 420. Symmetry-testing window 420 is displaced to the right by one length unit relative to symmetry testing window 400 (FIG. 15E) in region 360. Symmetry-testing window 420 is tested for horizontal symmetry. A symmetry-line 423 splits symmetry-testing window 420 into left window-section 421 and right window-section 422. Left and right window-sections 421 and 422 have equal areas. Symmetry-line 423 is significantly displaced to the right from symmetry-line.

With reference to FIG. 15H, absolute difference image 425 is produced by performing an operation of absolute subtraction between right window-section 422 (FIG. 15G) and a horizontally flipped form (not shown) of left window-section 421 (FIG. 15G). Absolute difference image 425 includes a non-zero region 426, a non-zero defect region 427 and a blank defect region 428. With reference to FIG. 15G, the geometric locus of non-zero region 428 is included in the geometric locus of object-image element 132 in the flipped form of window-section 421. The respective region in right window-section 422 has zero intensity, and hence, non-zero region 426 has non-zero intensity. The geometric locus of non-zero defect region is included in the geometric locus of defect 138 in right window-section 422. The respective region in left window-section has zero intensity, and hence, non-zero defect region 427 has non-zero intensity. The geometric locus of blank defect-region is included in the geometric locus of object-image element 132 in left window-section 421, and also in the geometric locus of defect 138 in right window-section 422, and hence, blank defect region has zero intensity.

The combined area of non-zero regions 427 and 428 in absolute difference image 425 is approximately equal to the combined area of non-zero regions in absolute difference image 370 (FIG. 15A). This indicates that symmetry-testing window 420 is approximately as close to being horizontally symmetrical as symmetry-testing window 362 (FIG. 15A).

With reference to FIG. 15I, region 360 includes object-image element 132, defect 138 (FIG. 2) and symmetry-testing window 430. Symmetry-testing window 430 is displaced to the right by approximately 0.25 length units relative to symmetry testing window 380 (FIG. 15C) in region 360. A vertical symmetry-line 433 splits symmetry-testing window 430 into left window-section 431 and right window-section 432. Left window-section 431 and right window-section 432 have equal areas. Symmetry-line 433 essentially coincides with symmetry-line 142. Symmetry-testing window 430 exhibits the best achieved symmetry, within the limitations of a given defect detection system, and hence, may be used to represent a theoretically symmetrical window.

With reference to FIG. 15J, absolute difference image 435 includes a defect region 436. Defect region 436 has the same geometric locus as defect region 138 in right window-section 432. The area of defect region 436 is smaller than each of the combined non-zero intensity areas in absolute subtraction images 370 (FIG. 15B), 390 (FIG. 15D), 410 (FIG. 15F) and 425 (FIG. 15H).

Figure 16:
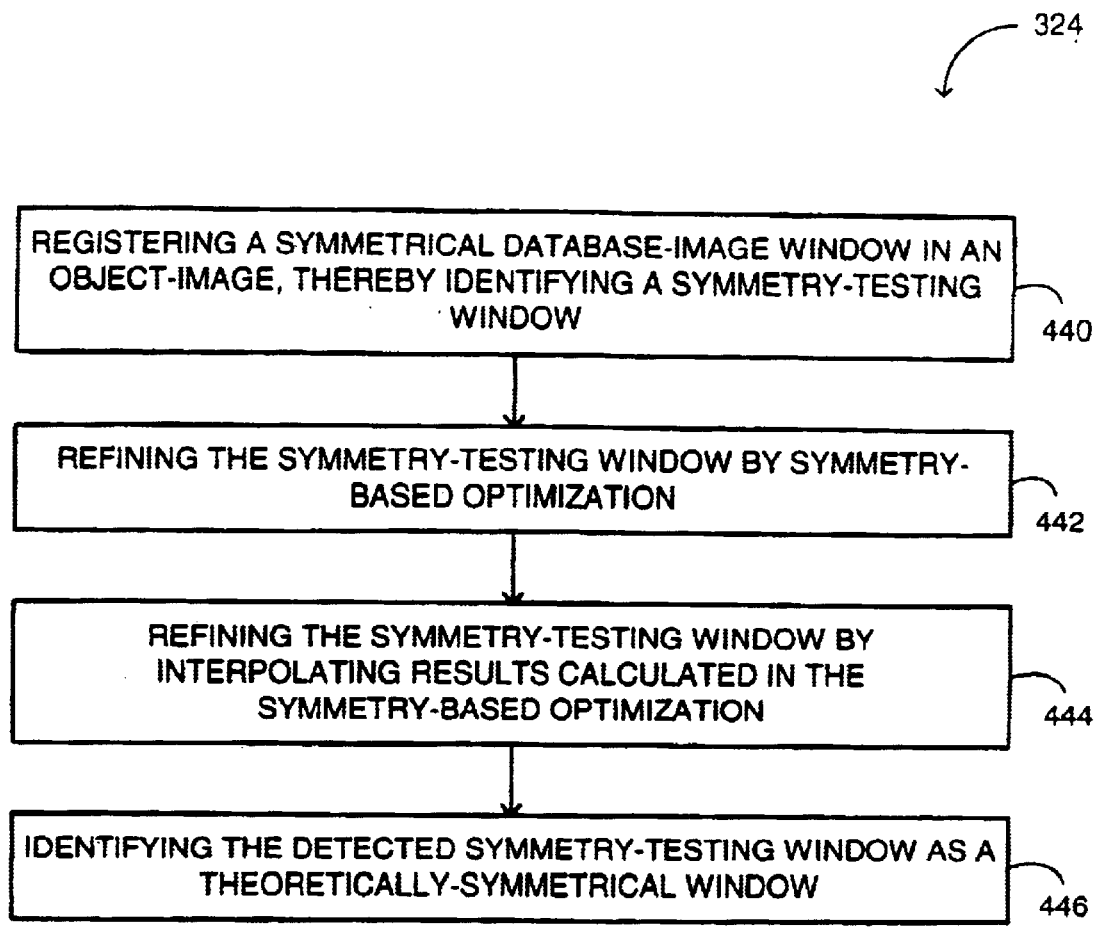
FIG. 16 is an illustration in detail of the procedure of identifying theoretically-symmetrical windows of the method of FIG. 12, in accordance with a further embodiment of the disclosed technique.

Reference is now made to FIG. 16, which is an illustration in detail of procedure 324 of the method of FIG. 12, in accordance with a further embodiment of the disclosed technique. According to the method of FIG. 16, the theoretically-symmetrical window is identified in the object-image in an optimization process.

In procedure 440, a symmetrical database-image window is registered with an object-image, thereby identifying a symmetry-testing window. The initial symmetry-testing window is an approximation of the respective theoretically-symmetrical window. It is noted that binary operations, such as subtraction, may generally be performed on registered images, by operating on each portion of the first image and the respective portion of the second image. A registration procedure is discussed with reference to FIG. 17.

In procedure 442, the symmetry-testing window is refined by symmetry-based optimization. Symmetry-based optimization is directed to identifying a symmetry-testing window, which is the closest to being symmetrical. Hence, a refined symmetry-testing window is identified by choosing the symmetry-testing window which least deviates from the expected symmetry thereof. The deviation from symmetry is determined in a similar process as applied to theoretically-symmetrical windows according to the method of FIG. 14. It is noted that refining the symmetry-testing window is not confined to refining the window coordinates, but may generally involve refining the window coordinates, refining the parameters associated with the symmetry properties thereof, and the like.

In procedure 444, the symmetry-testing window is refined by interpolating results calculated in the symmetry-based optimization. The interpolation yields a symmetry-testing window which was not tested for deviation from symmetry, but which is predicted to give optimal results according to the results produced in procedure 442. With reference to FIG. 15I, symmetry-testing window 430 is identified as a refined symmetry-testing window by interpolating the results from symmetry-testing windows 362 (FIG. 15B), 380 (FIG. 15D), 400 (FIG. 15F) and 420 (FIG. 15H).

In procedure 446, the detected symmetry-testing window is identified as a theoretically-symmetrical window. The theoretically-symmetrical window is then used in procedures 326 and 328 (FIG. 12), to determine the presence of defects.

It is noted that a method according to FIG. 16 may generally apply any of procedures 440, 442 and 444, or a combination thereof, depending on the precision and accuracy considerations of the inspection procedure, and the procedures may generally be performed in different orders. It is further noted the method of FIG. 16, or a procedure thereof, may further include pre-processing procedures, such as image smoothing and format conversion.

Figure 17:
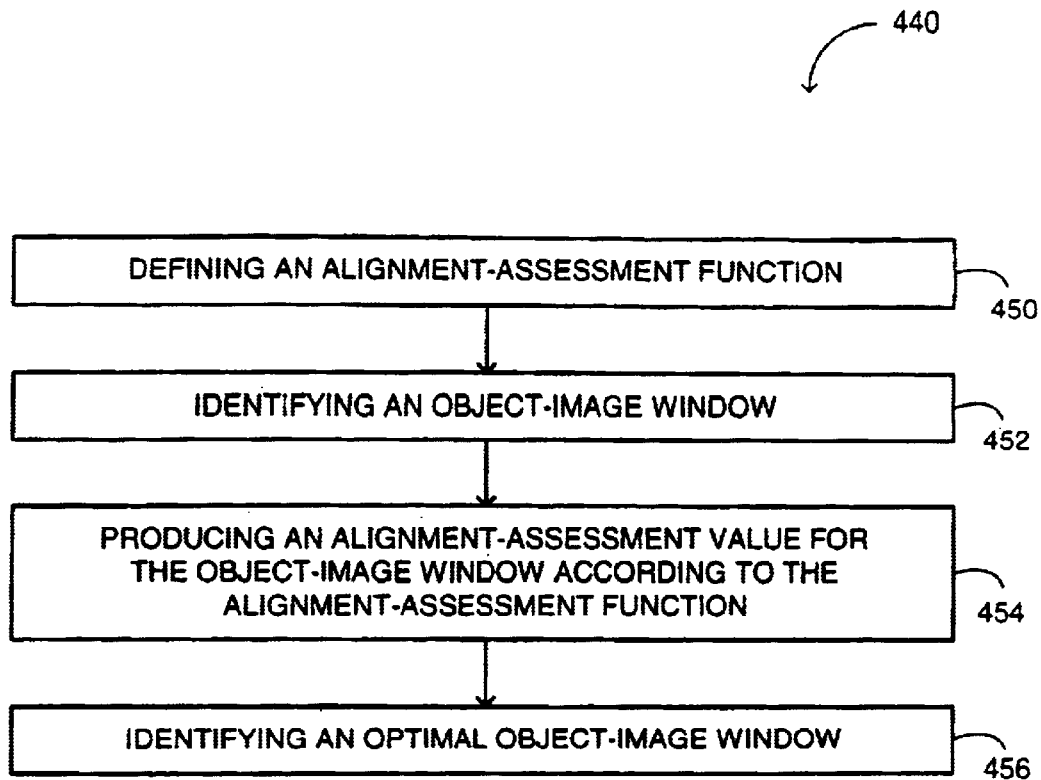
FIG. 17 is an illustration in detail of the registration procedure of the method of FIG. 16, according to another embodiment of the disclosed technique.

Reference is now made to FIG. 17, which is an illustration in detail of procedure 440 of the method of FIG. 16, according to another embodiment of the disclosed technique. In the example discussed herein below, it is assumed that the symmetrical database-image window and the respective object-image window are represented in similar ways, apart from a possible shift there between. In this case, registering the database-image window with the object-image, is performed by determining a horizontal and vertical shift there between.

In procedure 450, an alignment-assessment function is defined. The alignment-assessment function receives as input the shift between the symmetrical database-image window and the respective object-image window, and outputs a value, referred to herein below as a symmetry-assessment value, indicating how well they are aligned. For example, the alignment-assessment function may be the sum of the intensity absolute differences between pixels of the database-image window and respective pixels of the object-image window.

In procedure 452, an object-image window is identified. The initial object-image window may be defined at the same coordinates in the object-image as the respective symmetrical database-image window. Subsequent object-image windows are generally defined at nearby coordinates to the initial object-image window. The object-image windows may all be determined in advance, or they me be determined dynamically, based on preceding results.

In procedure 454, an alignment-assessment value is for the object-image window, is produced according to the alignment-assessment function. It is noted that the alignment-assessment value may be recorded for further reference. It is further noted that a sequence of procedures 452 and 454, may be repeated for a plurality of iterations, each of the iterations involving a different object-image window. In addition, procedure 452 can be performed for a plurality of windows, and then followed by procedure 454, for each of the identified windows.

In procedure 456, an optimal object-image window is identified. An optimal object-image window is the window yielding an optimal alignment-assessment value. For example, if the alignment-assessment function is the sum of intensity absolute differences, then the optimal object-image window is the window yielding a minimal sum of absolute differences. The optimal object-image window can then be identified as the initial symmetry-testing window in the subsequent procedures of the method of FIG. 16. It is noted that the optimal object-image window may be refined by interpolation, similar to the interpolation discussed herein below with reference to FIGS. 19, 20A and 20B.

Figure 18:
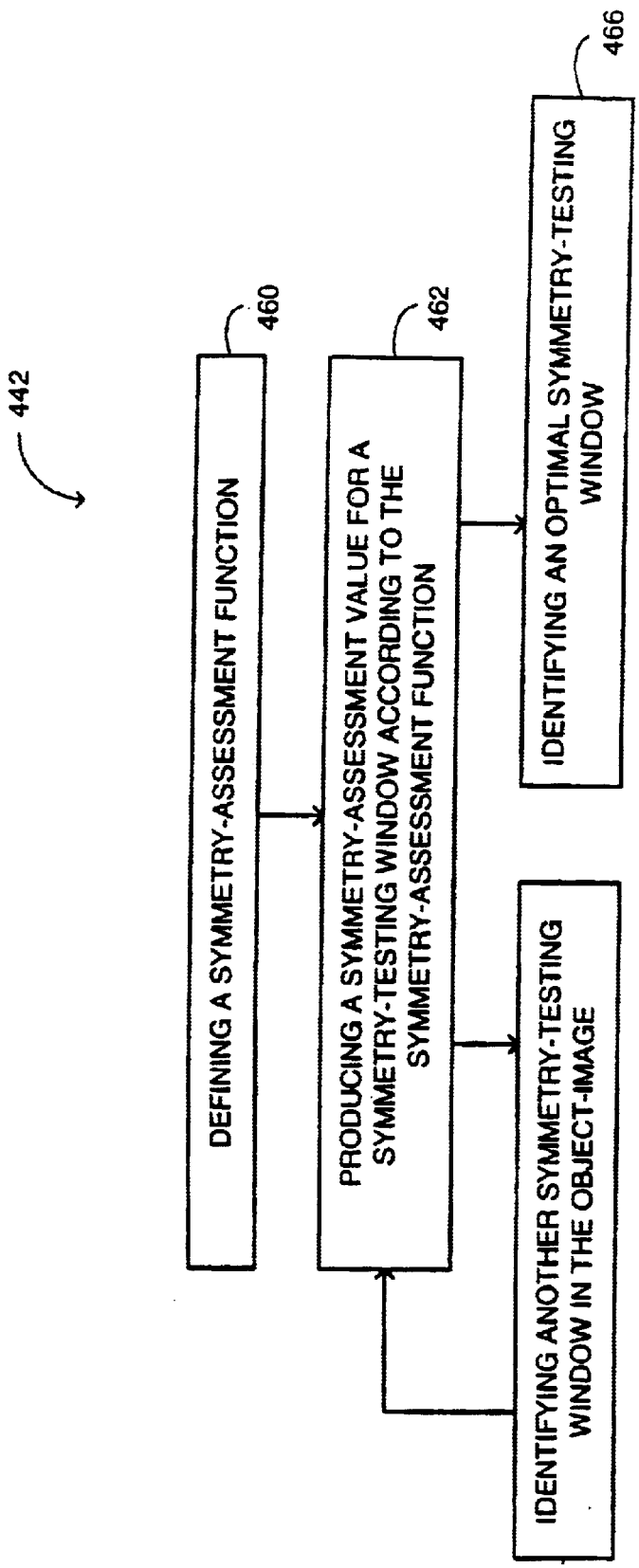
FIG. 18 is a schematic illustration of the symmetry-based optimization procedure of the method of FIG. 16, in accordance with a further embodiment of the disclosed technique.

Reference is now made to FIG. 18, which is an illustration in detail of procedure 442 of the method of FIG. 16, in accordance with a further embodiment of the disclosed technique. In procedure 460, a symmetry-assessment function is defined. The symmetry-assessment function receives as input a symmetry-testing window, and outputs a value, referred to herein below as a symmetry-assessment value, indicating the deviation from symmetry. In the example set forth in FIGS. 15A, 15B, 15C, 15D, 15E, 15F, 15G, 15H, 15I and 15J, a symmetry-assessment function may be represented by A(X), wherein X is the horizontal shift relative to an arbitrary reference point. The symmetry-assessment function A(X) is based on the presence of non-zero regions in the absolute difference image produced from the left window-section and the flipped right window-section of the symmetry-testing window. For example, $$A(X) = \sum_i \sum_j |L_{ij}(X) - R_{ij}(X)|,$$

wherein i and j are the horizontal and vertical coordinates of the absolute difference image, and $L_{ij}(X)$ and $R_{ij}(X)$ are the intensities of the pixel in the left window-section and right window-section, respectively, having coordinates i and j.

In procedure 462, a symmetry-assessment value is produced for a symmetry-testing window according to the symmetry-assessment function. The initial symmetry-testing window is identified in procedure 440. Subsequent symmetry-testing windows may be identified in the following procedure 464.

In procedure 464, another symmetry-testing window is identified in the object-image, when required (e.g., when the symmetry-assessment value does not meet a symmetry-assessment criteria, when a minimal number of iterations has yet to be reached, and the like). The symmetry-testing windows which are identified in procedure 464 are generally defined at nearby coordinates to the initial symmetry-testing window identified in procedure 440. The symmetry-testing windows may all be determined in advance, or they me be determined dynamically, based on preceding results. After executing procedure 464, the method proceeds from procedure 462.

It is noted that the symmetry-assessment value may be recorded for further reference. It is further noted that procedure 464 can be performed for a plurality of windows, and then followed by procedure 462, for each of the identified windows.

In the example set forth in FIG. 15A, symmetry-testing window 362 (FIG. 15A) is identified as an initial symmetry-testing window respective of database-image window 110 (FIG. 1), and symmetry-testing windows 380 (FIG. 15C), 400 (FIG. 15E) and 420 (FIG. 15G) are defined at locations which are horizontally-shifted in close vicinity thereto.

In procedure 466, an optimal symmetry-testing window is identified. The optimal symmetry-testing window is the symmetry-testing window yielding an optimal symmetry-assessment value. The optimal symmetry-testing window can then be identified as a refined symmetry-testing window in subsequent procedures of the method of FIG. 16. In the example set forth in FIGS. 15A, 15B, 15C, 15D, 15E, 15F, 15G and 15H, symmetry-testing window 400 (FIG. 15E) is identified as the optimal symmetry-testing window.

Figure 19:
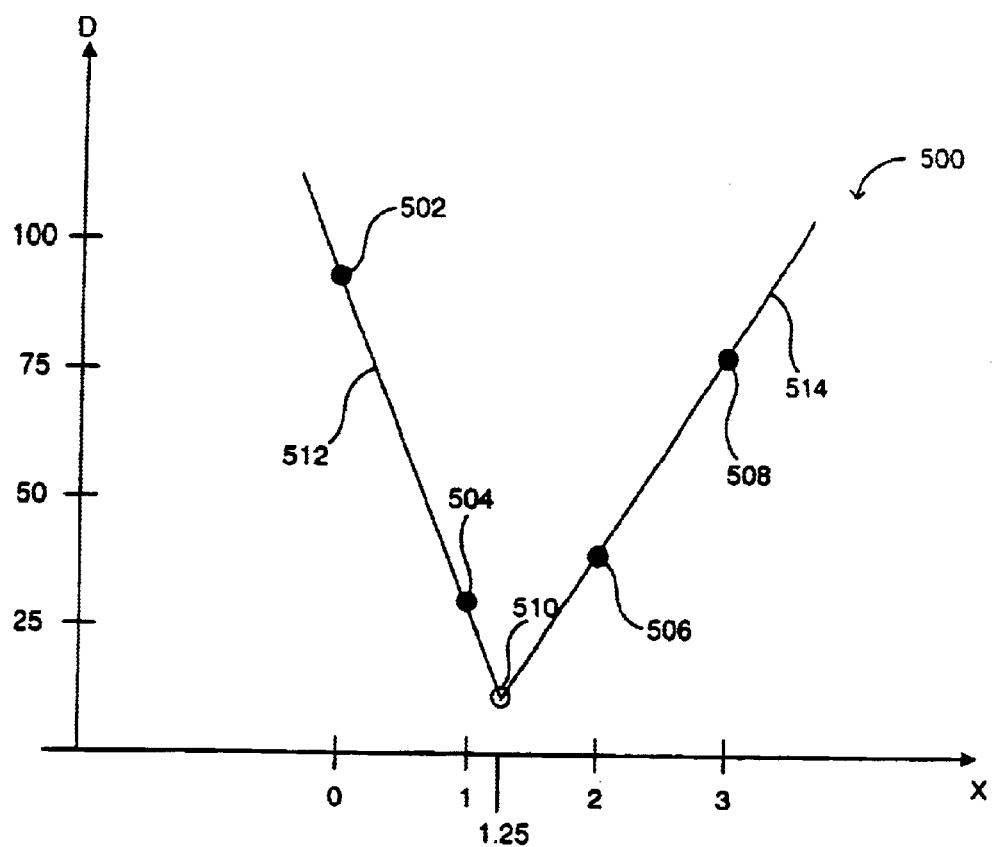
FIG. 19 is a schematic illustration of a scheme, representing deviation from symmetry versus horizontal displacement, which is used in the interpolation procedure of the method of FIG. 16, according to another embodiment of the disclosed technique.

Reference is now made to FIG. 19, which is a schematic illustration of a scheme, generally referenced 500, representing deviation from symmetry versus horizontal displacement, which is used in procedure 444 (FIG. 16) according to another embodiment of the disclosed technique.

Scheme 500 represents deviation-from-symmetry D versus horizontal shift X. The deviation-from-symmetry is defined according to the symmetry-assessment function A(X), used in the symmetry-based optimization of procedure 442. The deviation-from-symmetry D is illustrated using deviation units ranging from 0 to 100 in scheme 500. The unit, used to represent the horizontal shift X, is the horizontal displacement between successive windows in FIGS. 15A, 15C, 15E and 15G (e.g., the horizontal displacement between window 362 of FIG. 15A and window 380 of FIG. 15C).

Scheme 500 includes tested points 502, 504, 506, and 508, lines 512 and 514, and an interpolation point 510. The X-coordinate of each tested point represents the horizontal shift between the respective symmetry-testing window and symmetry-testing window 362 (which is an arbitrary reference). The D-coordinate of each tested point represents deviation from symmetry, which was calculated using the symmetry-assessment function A. The coordinates (X,D) of tested points 502, 504, 506 and 508 are (0,90), (1,30), (2,40) and (3,80), respectively.

Line 512 passes through tested points 502 and 504. Line 514 passes through tested points 506 and 508. In the example set forth in FIG. 19, the proposed interpolation is based on a simplified assumption, that the deviation D is approximately piecewise linear, with respect to horizontal shift, near the minimum point of deviation. It is noted that other assumptions may apply. Lines 512 and 514 are interpolated according to a piecewise linear approximation and intersect at interpolation point 510. The coordinates of interpolation point 510 are approximately (1.25, 15).

Interpolation point 510 represents an approximation of the symmetry-testing window that would yield a minimal value of A(X). Accordingly, the X and D coordinates of interpolation point 510 represent a refined shift, and an approximation of the respective deviation from symmetry, respectively. The D-coordinate of interpolation point 510 may be identified as the deviation from symmetry and used accordingly in procedures 326 and 328. Alternatively, the X-coordinate may be used to refine the symmetry-testing window. In scheme 500, tested points 502, 504, 506 and 508 represent symmetry-testing windows 362 (FIG. 15A), 380 (FIG. 15C), 400 (FIG. 15E) and 420 (FIG. 15G), respectively. Interpolation point 510 is used to define symmetry-testing window 430 (FIG. 15I).

Figure 20A:
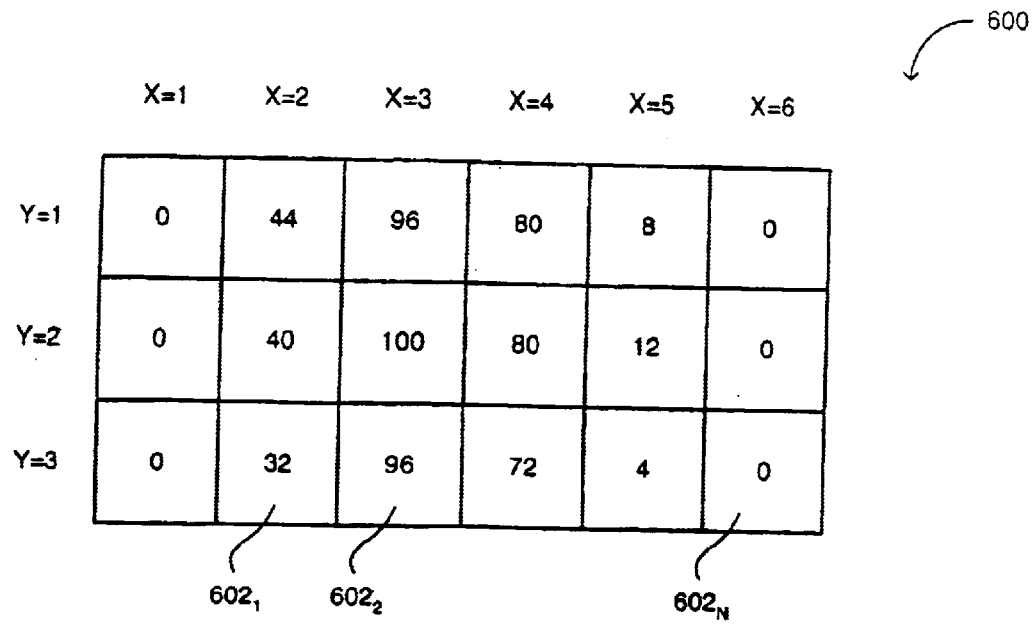
FIG. 20A is a schematic illustration of a pixel array, which represents an object-image region.
Figure 20B:
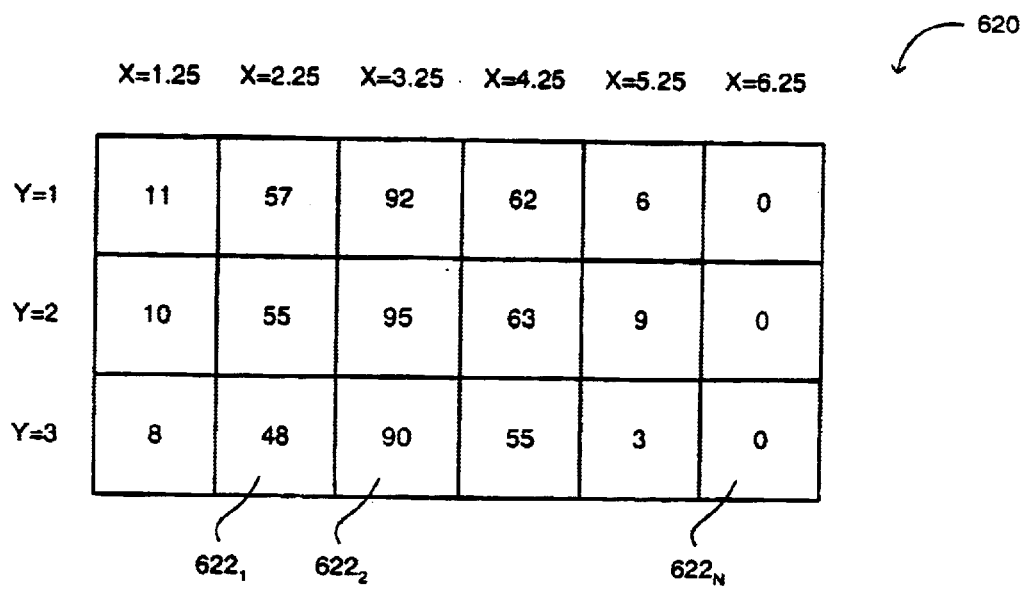
FIG. 20B is a schematic illustration of a shifted pixel array, constructed in accordance with a further embodiment of the disclosed technique.

Reference is now made to FIGS. 20A and 20B. FIG. 20A is a schematic illustration of a pixel array, generally referenced 540, which represents an object-image window (not shown). FIG. 20B is a schematic illustration of a shifted pixel array, generally referenced 580, constructed in accordance with a further embodiment of the disclosed technique.

With reference to FIG. 20A, pixel array 600 includes a plurality of square pixels, generally referenced 602$_i$, such as pixels 602$_1$, 602$_2$, and 602$_N$, arranged in a two-dimensional array. Pixels 602$_1$, 602$_2$ and 602$_N$ have (X,Y)-coordinates (2,3), (3,3) and (6,3), respectively, wherein X and Y represent horizontal and vertical position relative to an arbitrary reference point.

With reference to FIG. 20B, shifted pixel array 620 represents an object-image region (not shown), shifted by 0.25 pixels to the right from the object-image window represented by pixel array 600 (FIG. 20A). For example, an interpolation process similar to the one applied in FIG. 19, may identify the object-image window represented by shifted pixel array 620 as an optimal symmetry-testing window, whereby shifted pixel array 620 is produced for the purpose of testing this object-image window.

Shifted pixel array 620 is produced by interpolating the intensity values of pixel array 602, thereby approximating the intensity value at points shifted there from by 0.25 of a pixel. The example set forth in FIGS. 20A, 20B, operates under the assumption that $$I(X+0.25,Y) \approx I(X,Y)+0.25 \times (I(X+1,Y)-I(X,Y))$$

and hence, utilizes a simple linear approximation, namely:

$$I(X+0.25,Y)=I(X,Y)+0.25 \times (I(X+1,Y)-I(X,Y))=0.75 \times I(X,Y)+0.25 \times I(X+1,Y).$$

For example, pixel 622$_1$ (FIG. 20B) has (X,Y) coordinates (2.25,3), and hence, the intensity of pixel 622$_1$ is approximated by:

$$I(2.25,3)=0.75 \times I(2,3)+0.25 \times I(3,3).$$

Since pixels 602$_1$ and 602$_2$, having coordinates (2,3) and (3,3), respectively, have intensity values 32 and 96, respectively, the interpolation yields an approximated intensity value $0.75 \times 32 + 0.25 \times 96 = 48$.

It is noted, however, that various other approximations may be used. Accordingly, the approximated intensity value may depend on the intensity values of several pixels of the original pixel array. Mathematically, $$I(X',Y') = \sum_X \sum_Y K(X'-X, Y'-Y) I(X,Y),$$

wherein (X',Y') are the coordinates of the approximated intensity, and K(s,t) is a predetermined weight function (also known as a kernel function).

It will be appreciated by persons skilled in the art that the disclosed technique is not limited to what has been particularly shown and described hereinabove. Rather the scope of the disclosed technique is defined only by the claims, which follow.

What is claimed is:

1. Method for detecting defects, the method comprising the procedures of:

identifying theoretically-symmetrical windows in an object-image;

analyzing said theoretically-symmetrical windows according to expected symmetry of said theoretically-symmetrical windows; and determining the presence of defects according to a deviation from said expected symmetry.

2. The method according to claim 1, further comprising a preliminary procedure of scanning a physical object, thereby producing said object-image.

3. The method according to claim 2, further comprising a preliminary procedure of analyzing a database-image thereby identifying symmetrical database-image windows therein, wherein said theoretically-symmetrical windows are identified according to said symmetrical database-image windows.

4. The method according to claim 2, wherein said physical object is a photographic mask.

5. The method according to claim 2, wherein said physical object is a reticle.

6. The method according to claim 2, wherein said physical object is a printed material.

7. The method according to claim 2, wherein said physical object is a fabricated material.

8. The method according to claim 1, further comprising a preliminary procedure of analyzing a database-image thereby identifying symmetrical database-image windows therein, wherein said theoretically-symmetrical windows are identified according to said symmetrical database-image windows.

9. The method according to claim 8, wherein said procedure of analyzing said database-image comprises the procedures of:

identifying at least one database-image element; and determining a symmetrical database-image window for each of said at least one database-image element.

10. The method according to claim 9, wherein said procedure of analyzing a database-image further comprises a procedure of determining symmetry properties of said database-image element.

11. The method according to claim 10, wherein said procedure of analyzing said database-image further comprises a procedure of determining dimensions of said database-image element.

12. The method according to claim 9, wherein said procedure of analyzing a database-image further comprises a procedure of determining dimensions of said database-image element.

13. The method according to claim 8, wherein said procedure of identifying theoretically-symmetrical windows in an object-image, comprises procedures of:

registering a symmetrical database-image window in said object-image, thereby identifying an initial symmetry-testing window; and identifying said symmetry-testing window as a theoretically-symmetrical window.

14. The method according to claim 13, further comprising a procedure of refining said symmetry-testing window.

15. The method according to claim 14, wherein said procedure of refining said symmetry-testing window is performed according to a symmetry-based optimization.

16. The method according to claim 15, further comprising a procedure of refining said symmetry-testing window by interpolating results calculated in said symmetry-based optimization.

17. The method according to claim 15, wherein said procedure of refining said symmetry-testing window, comprises procedures of:

producing a symmetry-assessment value for said symmetry-testing window according to a symmetry-assessment function; and identifying an optimal symmetry-testing window.

18. The method according to claim 17, further comprising the procedure identifying another symmetry-testing window in said object-image, after said procedure of producing a symmetry-assessment value, wherein a sequence of said procedure of identifying another symmetry-testing window and said procedure of producing a symmetry-assessment value, is repeated for at least one iteration, each of said at least one iteration involving a different symmetry-testing window.

19. The method according to claim 17, wherein said procedure of refining said symmetry-testing window, further comprises a preliminary procedure of defining said symmetry-assessment function.

20. The method according to claim 13, wherein said procedure of registering a symmetrical database-image window in said object-image, comprises procedures of:

identifying an object-image window;

producing an alignment-assessment value for said object-image window according to an alignment-assessment function; and identifying an optimal object-image window;

wherein a sequence of said procedure of identifying an object-image window and said procedure of producing an alignment-assessment value, is repeated for a plurality of iterations, each of said plurality of iterations involving a different object-image window.

21. The method according to claim 20, wherein said procedure of registering a symmetrical database-image window in said object-image, further comprises a preliminary procedure of defining said alignment-assessment function.

22. The method according to claim 1, wherein said procedure of analyzing theoretically-symmetrical windows comprises procedures of:

identifying theoretically symmetrically-similar windows and a manipulation associated therewith, from said theoretically-symmetrical window;

manipulating at least one of said theoretically symmetrically-similar windows thereby producing a plurality of theoretically-identical windows; and comparing said theoretically-identical windows there between, thereby producing a comparison result.

23. The method according to claim 1, wherein said procedures are performed in real-time.

24. The method according to claim 1, wherein said expected symmetry is axial.

25. The method according to claim 1, wherein said expected symmetry is rotational.

26. The method according to claim 1, wherein said expected symmetry is axial-rotational.

27. System for detecting defects in an object-image, the system comprising:

a storage unit, at least storing at least a portion of said object-image; and a processor coupled with said storage unit, a database and a human interface, wherein said processor identifies theoretically-symmetrical windows in said at least a portion of said object-image, according to an analysis of at least a portion of a database-image retrieved from said database; and wherein said processor detects defects in said theoretically-symmetrical windows according to a deviation from expected symmetry properties of said theoretically-symmetrical windows.

28. The system according to claim 27, further comprising a scanner, producing said object-image.

29. The system according to claim 27, wherein said processor further identifies at least one database-image element in said database-image; and wherein said processor further determines a symmetrical database-image window respective of said at least one database-image element, when said database-image is symmetrical.

30. The system according to claim 29, wherein said processor further determines dimensions and symmetry properties of said database-image element.

31. The system of according to claim 30, wherein said processor registers a symmetrical database-image window in said object-image, thereby identifying a symmetry-testing window; and wherein said processor identifies said symmetry-testing window as a theoretically-symmetrical window.

32. The system according to claim 31, wherein said processor further refines said symmetry-testing window.

33. The system according to claim 32, wherein said processor performs said refining of said symmetry-testing window according to a symmetry-based optimization.

34. The system according to claim 33, wherein said processor further refines said symmetry-testing window by interpolating results calculated in said symmetry-based optimization.

35. The system according to claim 33, wherein said processor further refines said symmetry-testing window by interpolating results calculated in said symmetry-based optimization.

36. The system according to claim 27, wherein said storage unit further stores said database.

* * * * *